(12) United States Patent
Hamajima

(10) Patent No.: US 8,138,551 B2
(45) Date of Patent: Mar. 20, 2012

(54) SEMICONDUCTOR DEVICE WITH TRANSISTORS AND ITS MANUFACTURING METHOD

(75) Inventor: Tomohiro Hamajima, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 121 days.

(21) Appl. No.: 12/385,139

(22) Filed: Mar. 31, 2009

(65) Prior Publication Data

US 2009/0250761 A1    Oct. 8, 2009

(30) Foreign Application Priority Data

Apr. 7, 2008   (JP) .................. 2008-099014

(51) Int. Cl.
*H01L 21/336* (2006.01)
*H01L 21/70* (2006.01)
(52) U.S. Cl. ......... 257/368; 257/E21.616; 257/E27.098; 438/279
(58) Field of Classification Search .................. 438/279
See application file for complete search history.

(56) References Cited

U.S. PATENT DOCUMENTS

| 7,239,538 B2 | 7/2007 | Asayama et al. |
| 2006/0171192 A1 | 8/2006 | Asayama et al. |
| 2008/0067573 A1* | 3/2008 | Jang et al. ............ 257/315 |
| 2009/0218627 A1* | 9/2009 | Zhu ............... 257/368 |

FOREIGN PATENT DOCUMENTS

| JP | 7-263677 | 10/1995 |
| JP | 2006-210736 | 8/2006 |

* cited by examiner

*Primary Examiner* — Ha Tran T Nguyen
*Assistant Examiner* — Shaka Scarlett
(74) *Attorney, Agent, or Firm* — McGinn IP Law Group, PLLC

(57) ABSTRACT

A semiconductor device includes a semiconductor substrate, a first transistor including a first gate electrode, a first diffusion region, and a second diffusion region respectively formed above the semiconductor substrate, second transistor including a second gate electrode, the first diffusion region, and a third diffusion region respectively formed above the semiconductor substrate, and a node electrode formed above the first diffusion layer, and coupled thereto. The first gate electrode and the second gate electrode are formed separately at respective side walls of the node electrode.

12 Claims, 23 Drawing Sheets

SEMICONDUCTOR DEVICE WITH TRANSISTORS AND ITS MANUFACTURING METHOD

INCORPORATION BY REFERENCE

This application is based upon and claims the benefit of the priority from Japanese Patent Application No. 2008-099014 which was filed on Apr. 7, 2008, the disclosure of which is incorporated herein in its entirety by reference.

BACKGROUND OF THE INVENTION

1. Field of the Invention

The present invention relates to a semiconductor device and to a method of manufacturing the same, and more particularly to a semiconductor device that includes transistors and to a method of manufacturing the same.

2. Description of Related Art

Miniaturization of semiconductor devices is now under a rapid progress. And in order to catch up with this progress, miniaturization of transistors used in those semiconductor devices is also accelerated. Furthermore, along with the progress of such miniaturization of those semiconductor devices and transistors, the dimensional accuracy required for their manufacturing processes is getting more and more strict. However, it is still difficult to prevent dimensional variation among such transistors to be caused by their manufacturing processes while it is required that those transistors are formed very accurately in desired sizes.

Under such circumstances, JP-A-Hei 7-263677 discloses a technique for obtaining a MOS transistor that includes minute gate electrodes manufactured very accurately. FIG. 1A through 1D are cross sectional views of the semiconductor device disclosed in JP-A-Hei 7-263677 with respect to its manufacturing method. At first, as shown in FIG. 1A, an insulation film pattern 311 is formed in a predetermined region partitioned by an element isolation layer 305 on a semiconductor substrate 301. After this, as shown in FIG. 1B, a gate insulation film 309 is formed all over the semiconductor device 301 so as to cover the insulation film pattern 311, then a conductive film 308b is formed all over the gate insulation film 309. In FIG. 1B, the gate insulation film 309 formed on the insulation film pattern 311 and the insulation film pattern 311 merge into one, so the insulation film 309 is omitted here as a separate label. Then, as shown in FIG. 1C, the conductive film 308b is etched back in an anisotropic process to form a gate electrode 308 at the side wall of the insulation film pattern 311; the side wall remains as is. After this, as shown in FIG. 1D, the gate insulation film 309 and the insulation film pattern 311 except for the portion under the gate electrode 308 are removed by etching. Then, a source-drain region (not shown) is formed at both sides of the gate electrode 308.

As a related technique, JP-A-2000-210736 discloses another semiconductor device. This semiconductor device includes SRAM cells, each of which includes a first drive transistor, a second drive transistor, a first passage transistor, a second passage transistor, a third passage transistor, and a fourth passage transistor. The first drive transistor constitutes an n-conductivity type first inverter. The second drive transistor has an input terminal and an output terminal that are connected to the output terminal and the input terminal of the first inverter respectively to form a second inverter. The second drive transistor is n-conductivity type. The first passage transistor is provided in a route between the output terminal of the first inverter and the first bit line. The second passage transistor is provided in a route between the output terminal of the second inverter and the second bit line. The third passage transistor is provided in a route between the first passage transistor and the first bit line. The fourth passage transistor is provided in a route between the second passage transistor and the second bit line. And each drive transistor and each passage transistor are equal in gate width or in gate length.

SUMMARY

However, the present inventor has recognized the following point. Namely, in case of the semiconductor device manufacturing method disclosed in JP-A-Hei 7-263677, the gate electrode 308 is formed at both sides of the insulation film pattern 311 (FIG. 1D) in a self-alignment manner respectively. The insulation film pattern 311 is removed after the gate electrode 308 is formed (FIG. 1D). However, this manufacturing method causes the gate electrode 308 having a minute gate length to be isolated without any support. As a result, it is expected that the gate electrode 308 might develop such problems as pattern chipping, pattern falling, etc. In addition, while the insulation film pattern 311 is removed by dry-etching (FIG. 1D), the gate electrode 308 comes also to be etched to small dimensions. And this might cause the gate length to become insufficient and to be varied more. Furthermore, although not shown here, in case of this manufacturing method, an interlayer insulation film is formed after the insulation film pattern 311 is removed, then a contact hole is formed in the insulation film. This means that a contact hole is also formed between two gate electrodes 308 formed like side walls. It is thus required here to design the shape of the insulation film pattern 311 by premising that the contact hole is to be formed between those two gate electrodes 308. In other words, it is required to secure a space including a margin between a gate electrode 308 and the contact and this might disable sufficient reduction of the distance between those two gate electrodes 308. Therefore, the semiconductor device manufacturing method disclosed in JP-A-Hei 7-263677 does not overcome such problems as low manufacturing yield, pattern chipping, size variation, etc., and the miniaturization of transistors will also be disturbed by the limited space between gate electrodes.

The present invention seeks to solve one or more of the above problems, or to improve upon those problems at least in part.

In one exemplary embodiment, a semiconductor device according to the present invention includes a semiconductor substrate, a first transistor including a first gate electrode, a first diffusion region, and a second diffusion region respectively formed above the semiconductor substrate, second transistor including a second gate electrode, the first diffusion region, and a third diffusion region respectively formed above the semiconductor substrate, and a node electrode formed above the first diffusion layer, and coupled thereto. The first gate electrode and the second gate electrode are formed separately at respective side walls of the node electrode.

In another exemplary embodiment, a nonvolatile semiconductor storage device according to the present invention includes a semiconductor substrate, a first diffusion region on the semiconductor substrate, a second diffusion region on the semiconductor substrate, a third diffusion region on the semiconductor substrate, a node electrode coupled to the first diffusion region, an insulating layer formed on a side of the node electrode, a first gate electrode formed as a side wall of the node electrode and the insulating layer, and disposed between the first diffusion region and the second diffusion region, a second gate electrode formed as the side wall of the node electrode and the insulating layer, and disposed between the first diffusion region and the third diffusion region.

According to the present invention, the first gate electrode and the second gate electrode are paired and formed separately at the side wall of the node electrode in a self-alignment manner. The node electrode functions as an electrode connected to the first diffusion region between two transistors. This means that the node electrode is related indivisibly to the first and second gate electrodes and formed unitarily and in a self-alignment manner. Thus the node electrode comes to play a very important role. And the node electrode is indispensable to prevent the first and second gate electrodes and from being isolated without any support and to prevent occurrence of such problems as gate electrode pattern chipping, pattern falling, etc. In addition, after the first and second gate electrodes are formed, there is no need to remove the node electrode. This makes it possible to avoid such problems as insufficient gate length and gate length variation that might otherwise occur due to the additional etching required for the first and second gate electrodes.

Furthermore, according to the present invention, because the first and second gate electrodes are paired and formed separately on the side wall of the node electrode in a self-alignment manner, those minute gate electrodes can be formed very accurately. And this technique has a merit that the first and second gate electrodes, paired and formed in a self-alignment manner so as to face each other, come to have the same tendency in dimensional variation. This means that at least two transistors that are paired and have the same tendency in dimensional variation can be used effectively in each circuit that requires such a pair of transistors. The SRAM cell is a circuit that can have such a benefit. The use of this pair of transistors in a SRAM cell, for example, will thus reduce the variation of the cell ratio (to be described later).

Furthermore, according to the present invention, the node electrode and the gate electrodes of two transistors are united into one. And the first diffusion region is formed under the node electrode and connected to the node electrode. And in this case, it is not required to form any contact hole in the node electrode portion. It is also not required here to secure any dimensional margin for the contact hole between two transistors disposed side by side. The semiconductor device of the present invention can thus be minimized in size with less restriction.

In yet another exemplary embodiment, a semiconductor device manufacturing method according to the present invention includes forming an insulating layer including an opening part above a semiconductor substrate, injecting impurities on a surface region of the semiconductor substrate corresponding to the opening part, burying the opening part with a first conductive layer to form a node electrode, etching the insulating layer except for that at both side walls of the node electrode, forming a second conductive layer so as to cover the node electrode, etching the second conductive layer to form a first gate electrode and a second gate electrode separately at the both side walls of the node electrode via the insulating layer, and injecting impurities on a surface region of the semiconductor substrate corresponding to a side of each of the first gate electrode and the second gate electrode.

The above-described effects can also be obtained by any semiconductor devices manufactured by the exemplary semiconductor device manufacturing method of the present invention.

The present invention can therefore obtain a semiconductor device manufactured minutely and accurately in size, and improved in manufacturing yield.

BRIEF DESCRIPTION OF THE DRAWINGS

The above and other purposes, advantages and features of the present invention will become more apparent from the following description of certain exemplary embodiments taken in conjunction with the accompanying drawings in which.

DETAILED DESCRIPTION OF THE EXEMPLARY EMBODIMENTS

The invention will now be described herein with reference to illustrative exemplary embodiments. Those skilled in the art will recognize that many alternative embodiments can be accomplished using the knowledge of the present invention and that the invention is not limited to the exemplary embodiments illustrated for explanatory purposes.

First Exemplary Embodiment

Figure 1A:
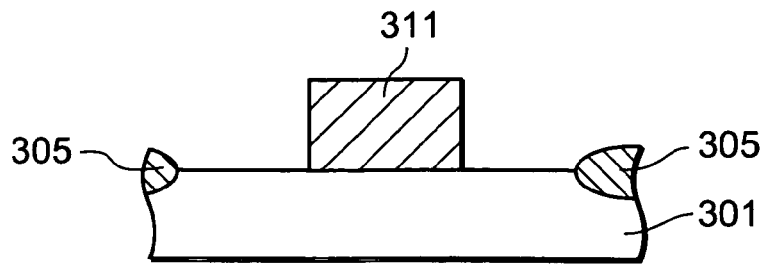
FIG. 1A is a cross sectional view showing a manufacturing method for a semiconductor device of JP-A-Hei 7-263677.
Figure 1B:
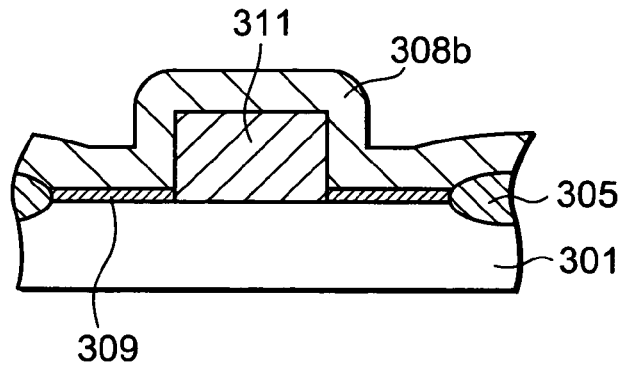
FIG. 1B is a cross sectional view showing a manufacturing method for a semiconductor device of JP-A-Hei 7-263677.
Figure 1C:
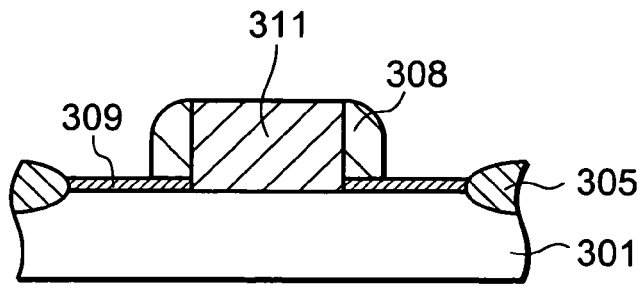
FIG. 1C is a cross sectional view showing a manufacturing method for a semiconductor device of JP-A-Hei 7-263677.
Figure 1D:
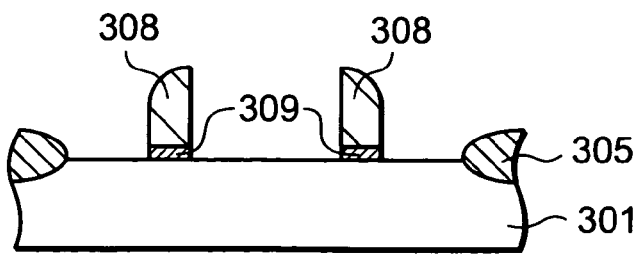
FIG. 1D is a cross sectional view showing a manufacturing method for a semiconductor device of JP-A-Hei 7-263677.
Figure 2:
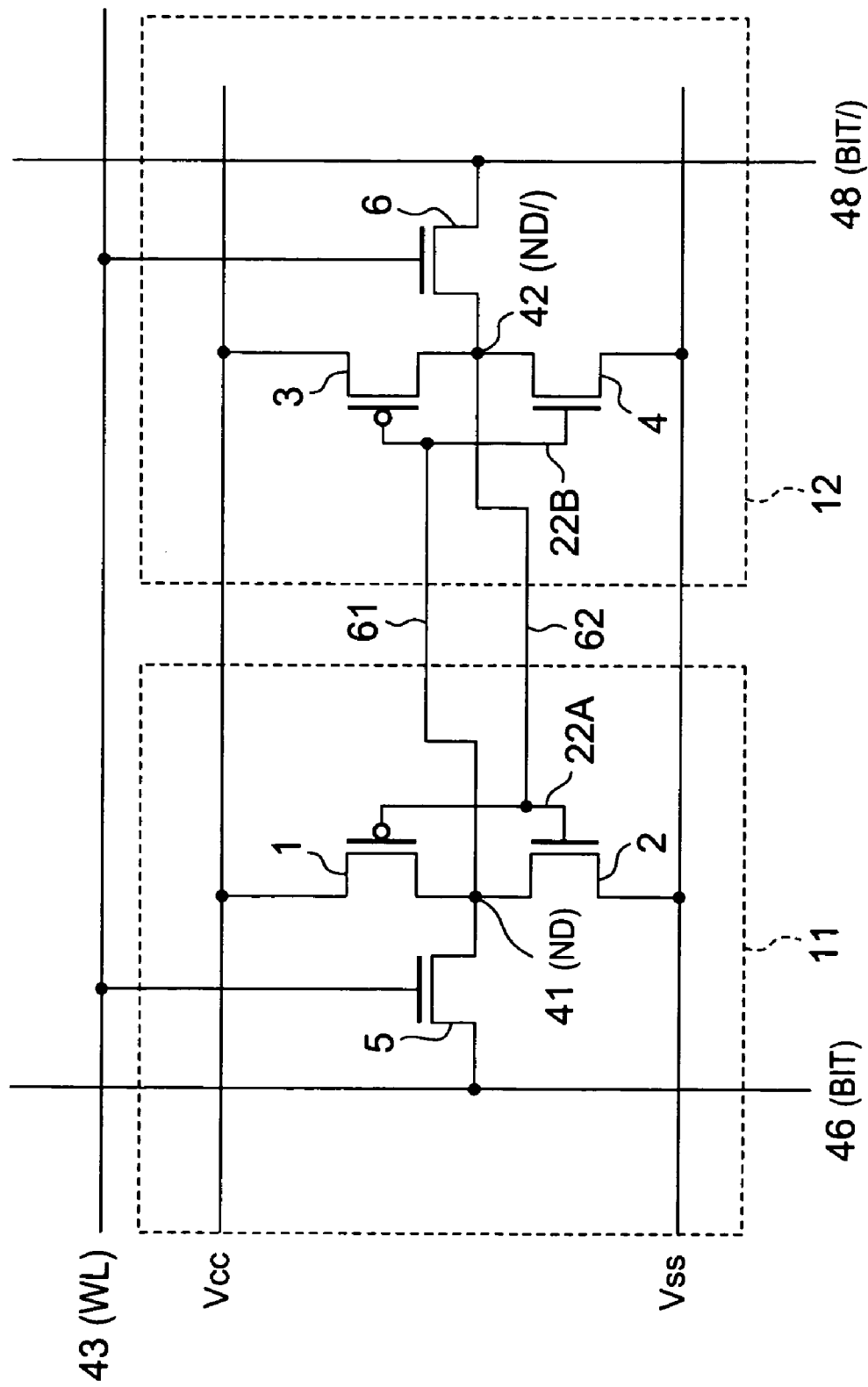
FIG. 2 is a circuit diagram showing a configuration of a semiconductor device according to a first exemplary embodiment of the present invention.

At first, there will be described a configuration of the semiconductor device in the first exemplary embodiment of the present invention. In the first exemplary embodiment, a static random access memory (SRAM) will be picked up as an example of the semiconductor device of the present invention. FIG. 2 is a circuit diagram of the semiconductor device in a configuration employed in the first exemplary embodiment of the present invention. The SRAM unit cell includes sub-unit blocks 11 and 12. The sub-units 11 and 12 are put together to constitute one memory unit (SRAM unit cell).

The sub-unit block 11 includes two NMOS transistors (access transistor 5 and driver transistor 2) and one PMOS transistor (load transistor 1). A memory node (ND) 41 is provided between the driver transistor 2 and the load transistor 1. The access transistor 5 includes a gate electrode connected to a word line (WL) 43 and a source-drain electrode having one side connected to another bit line (BIT) 46 and the other side connected to a memory node (ND) 41. The driver transistor 2 includes a gate electrode connected to the gate electrode of the driver transistor 2 and a source-drain electrode having one side connected to a power supply Vcc and the other side connected to the memory node (ND) 41.

On the other hand, the other sub-unit block 12 disposed so as to face the sub-unit block 11 also has the same transistor configuration as that of the sub-unit block 11. In other words, the sub-unit block 12 includes two NMOS transistors (access transistor 6 and driver transistor 4) and one PMOS transistor (load transistor 3). A memory node (ND/) 42 is provided between the driver transistor 4 and the load transistor 3. The access transistor 6 includes a gate electrode connected to a word line (WL) 43, a source-drain electrode having one side connected to another bit line (BIT/) 48 and the other side connected to the memory node (ND/) 42. The driver transistor 4 includes a gate electrode connected to the gate electrode of the driver transistor 3 and a source-drain electrode having one side connected to a power supply Vcc and the other side connected to the memory node (ND/) 42.

The driver transistor 2 and the gate electrode (gate electrode 22A (to be described later)) of the load transistor 1 in the sub-unit block 11 are connected to the memory node 42 of the sub-unit 12 through a wiring layer 62 respectively. On the other hand, the driver transistor 4 and the gate electrode (gate electrode 22B (to be described later)) of the load transistor in the sub-unit 12 are connected to the memory node 41 of the sub-unit block 11 through a wiring layer 61 respectively.

Figure 3:
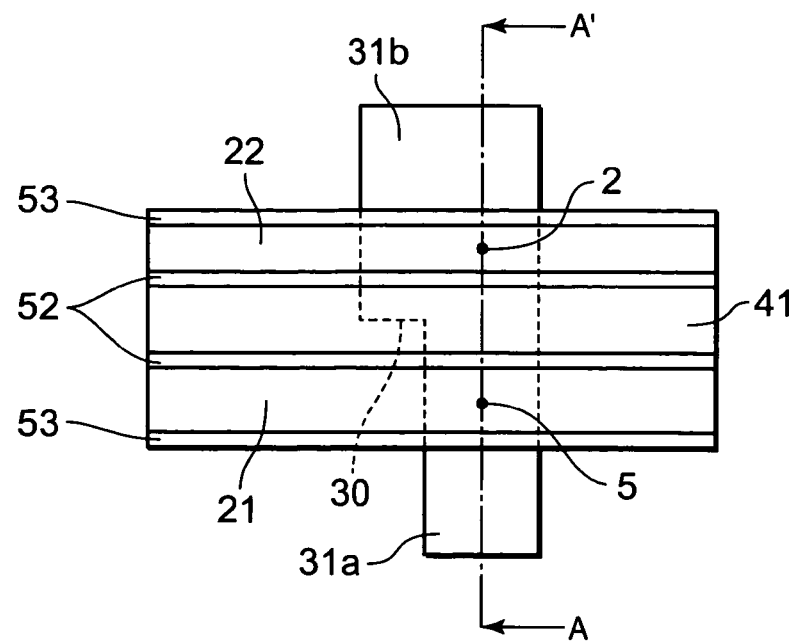
FIG. 3 is a partial top view showing a sub-unit block of a semiconductor device according to the first exemplary embodiment of the present invention.

FIG. 3 is a partial top view of a sub-unit block of the semiconductor device in a configuration employed in the first exemplary embodiment of the present invention. In the sub-unit block 11, the access transistor 5 includes a gate electrode 21; an N-type diffusion layer region 30 corresponding to one side of its source-drain electrode, and another N-type diffusion layer region 30 corresponding to the other side of the source-drain region. The N-type diffusion layer region 30 is provided under the node electrode 41 that functions as a memory node. The gate electrode 21 has a side wall insulation film 52 on one side wall and a spacer insulation layer 53 on the other side wall thereof.

On the other hand, the driver transistor 2 includes a gate electrode 22; an N-type diffusion layer region 31*b* corresponding to one side of its source-drain electrode, and another N-type diffusion layer region 30 corresponding to the other side of the source-drain electrode. The N-type diffusion layer region 30 is the same as that 30 of the access transistor 5. However, the N-type diffusion layer region 30 is wider at the side of the driver transistor 2 and narrower at the side of the access transistor 5 relatively. In other words, the N-type diffusion layer region 31*b* is wider than the N-type diffusion layer region 31*a*. The gate electrode 22 has a side wall insulation film 52 on one side wall and a spacer insulation layer 53 on the other side wall thereof.

The node electrode 41 (memory node 41) is provided between the gate electrodes 21 and 22 and a side wall insulation film 52 is provided between 41 and 21 and between 41 and 22 respectively; the film 52 is formed at both side walls of the node electrode 41 respectively. The node electrode 41 functions as a memory node and it is shared by the access transistor 5 and the driver transistor 2 as a wiring layer of the N-type diffusion layer region 30. The node electrode 41 is formed between the gate electrodes 21 and 22 unitarily with those electrodes 21 and 22 with a side wall insulation film 51 therebetween respectively. Under the gate electrode 41 is provided an element isolation pattern (not shown) and an N-type diffusion layer region 30. The node electrode 41 and the N-type diffusion layer region 30 are connected directly to each other with no insulation material therebetween.

Figure 4:
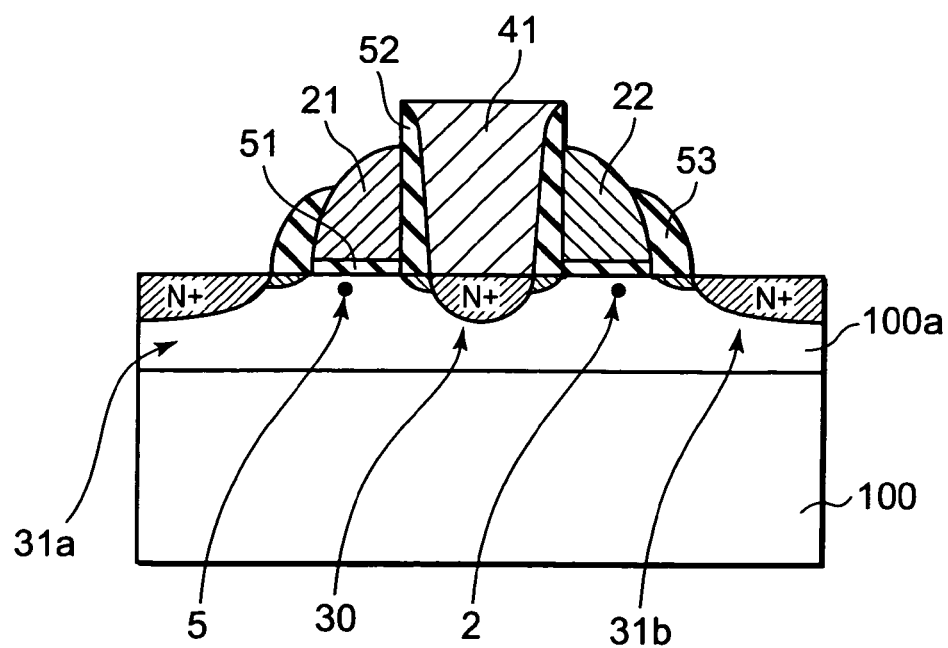
FIG. 4 is a cross sectional view showing a structure along lines A-A' of FIG. 3.

FIG. 4 is a cross sectional view taken on line A-A' of FIG. 3.

The node electrode 41 is provided directly on the N-type diffusion layer region 30 provided in the surface region of a well 100*a* of the semiconductor substrate 100. The access transistor 5 and the driver transistor 2 are formed unitarily with the node electrode 41 therebetween; a sidewall insulation film 52 is provided between each of the transistors 5 and 2 and the node electrode 41. The gate electrodes 21 and 22 are formed at a predetermined thickness on the well 100*a* of the semiconductor substrate 100 with a gate insulation film 51 therebetween. Out side each of the gate electrodes 21 and 22 is provided a spacer insulation layer 53 so as to enable the gate electrodes 21 and 22 to be insulated electrically from the N-type diffusion layer regions 31*a* and 31*b* that function as source-drain regions. The gate length (width on the crossing section of the gate electrode) of the access transistor 5 and the driver transistor 2 formed at the side faces of the node electrode 41 is determined by the width of the crossing section of the gate electrodes 21 and 22. The access transistor 5 and the driver transistor 2 formed at the side faces of the node electrode 41 share one side of the source-drain region commonly in the N-type diffusion layer region 30 formed just under the node electrode 41 and are connected to the node electrode 41 respectively.

So far, the access transistor 5, the driver transistor 2, the node electrode 41, and their related sections in the sub-unit block 11 have been described with reference to FIGS. 3 and 4. The same descriptions can also apply to the access transistor 6, the driver transistor 4, the node electrode 42 (memory node 42), and their related sections in the sub-unit block 12. The load transistors 1 and 3 may be replaced with ordinary transistors or with resistance elements respectively.

Next, there will be described the read and write operations with respect to the SRAM shown in FIG. 2. In case of reading data from the SRAM, it is premised here that the potential of the node electrode 41 denotes the "L" level and the potential of the other node electrode 42 denotes the "H" level. In this state, the potential of the word line 43 is set at the "H" level to turn on the access transistors 5 and 6. Then, the bit line 46 is discharged. At this time, the potential difference between the bit lines 46 and 48 is detected, thereby data is read from the latch circuit of the SRAM.

In case of writing data to the SRAM, it is premised here that the potential of the node electrode 41 is set at the "H" level and the potential of the node electrode 42 is set at the "L" level when data is written to the SRAM. In this state, at first, the potential of one of the pre-charged bit lines (the bit line 46 here) is kept at the "H" level while the potential of the other bit line (the bit line 48 here) is set at the "L" level. Then, in this state, the potential of the word line 43 is set at the "H" level. Consequently, the access transistors 5 and 6 are turned on, thereby the potentials of the node electrodes 41 and 42 are set at the "H" and "L" levels respectively. Data can thus be written in the latch circuit of the SRAM.

Next, there will be described how to manufacture the semiconductor device in the first exemplary embodiment of the present invention. FIGS. 5 through 12 are cross sectional views of the semiconductor device with respect to an example of its manufacturing method employed in the first exemplary embodiment of the present invention. The well 10*a* is omitted from the description to be made below.

Figure 5:
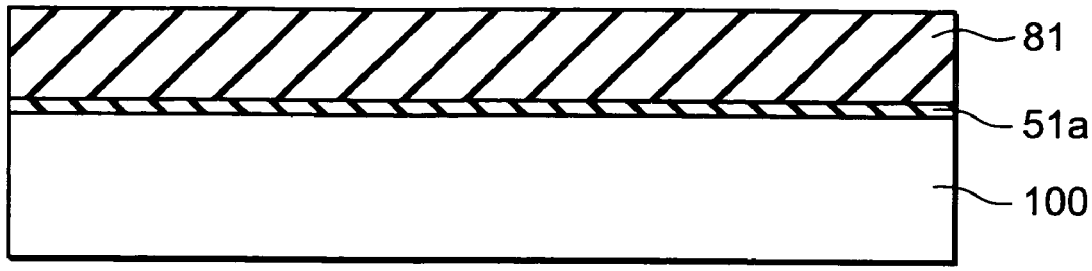
FIG. 5 is a cross sectional view showing a manufacturing method for a semiconductor device according to the first exemplary embodiment of the present invention.

At first, as shown in FIG. 5, a first insulation film 51*a* (e.g., oxide film) and a nitride film 81 (e.g., silicon nitride film) are deposited at predetermined thicknesses respectively on the surface of the semiconductor substrate 100 (e.g., silicon substrate).

Figure 6:
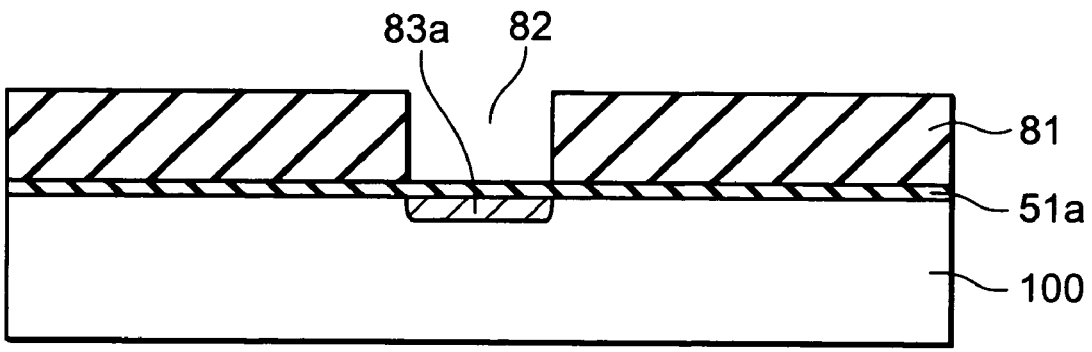
FIG. 6 is another cross sectional view showing the manufacturing method for the semiconductor device according to the first exemplary embodiment of the present invention.

After this, a photoresist is applied on the nitride film 81 to form a photoresist pattern in a predetermined shape. Then, the nitride film 81 masked by the photoresist (not shown) is etched to form an opening part in a predetermined shape as shown in FIG. 6. Then, impurities are injected through the first insulation film 51*a* provided at the bottom of the opening part 82 and masked by the photoresist and by the nitride film 81 to form a first impurity injection layer 83*a*.

Figure 7:
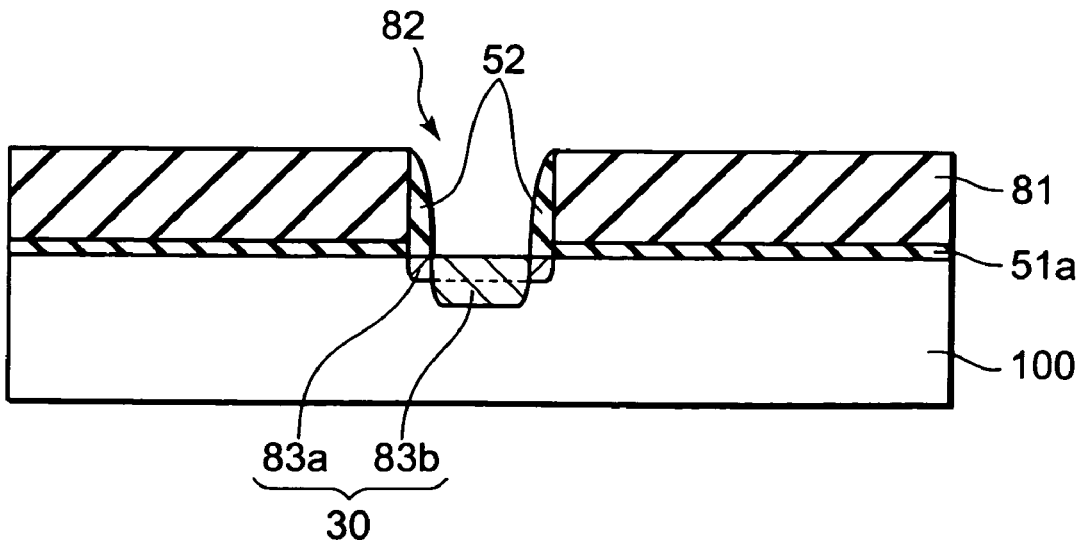
FIG. 7 is still another cross sectional view showing the manufacturing method for the semiconductor device according to the first exemplary embodiment of the present invention.

After this, a second insulation film (not shown, e.g., silicon oxide film) is deposited at a predetermined thickness by a chemical vapor deposition (CVD) method or the like as shown in FIG. 7. The second insulation film is then dry-etched to form a side wall insulation film 52 in the opening part 82. After this, impurities are injected into the opening part 82 through the first insulation film 51*a* to form a second impurity injection layer 83*b*. Then, the first insulation film 51 a exposed at the bottom of the opening part 82 is removed by etching. The N-type diffusion layer region 30 is constituted by the first impurity injection layer 83a and by the second impurity injection layer 83b respectively.

Figure 8:
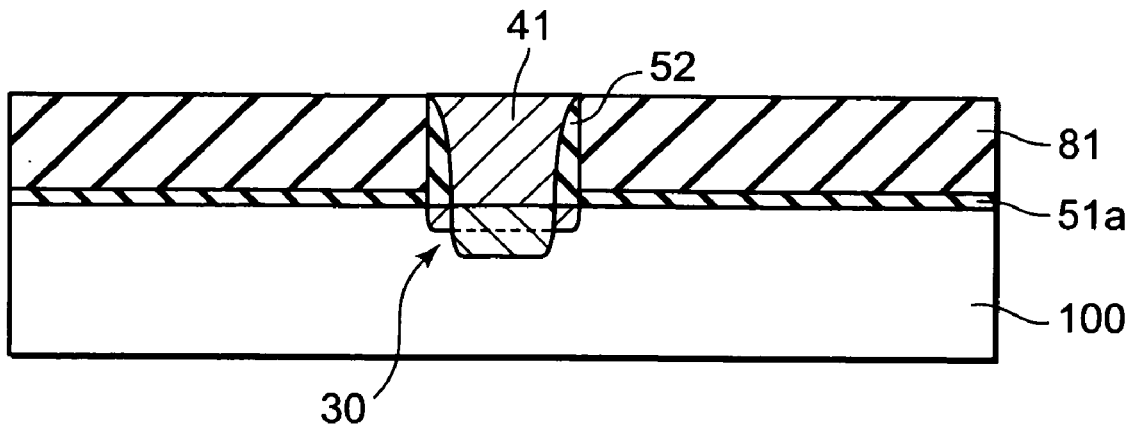
FIG. 8 is still another cross sectional view showing the manufacturing method for the semiconductor device according to the first exemplary embodiment of the present invention.

After this, as shown in FIG. 8, a first polycrystalline silicon film (not shown) is deposited at a predetermined thickness to fill the opening part 82. Then, the surplus first polycrystalline silicon film on the nitride film 81 is etched back and removed by dry-etching. As a result, only the first polycrystalline silicon film (node electrode 41) buried in the opening part 82 remains.

Figure 9:
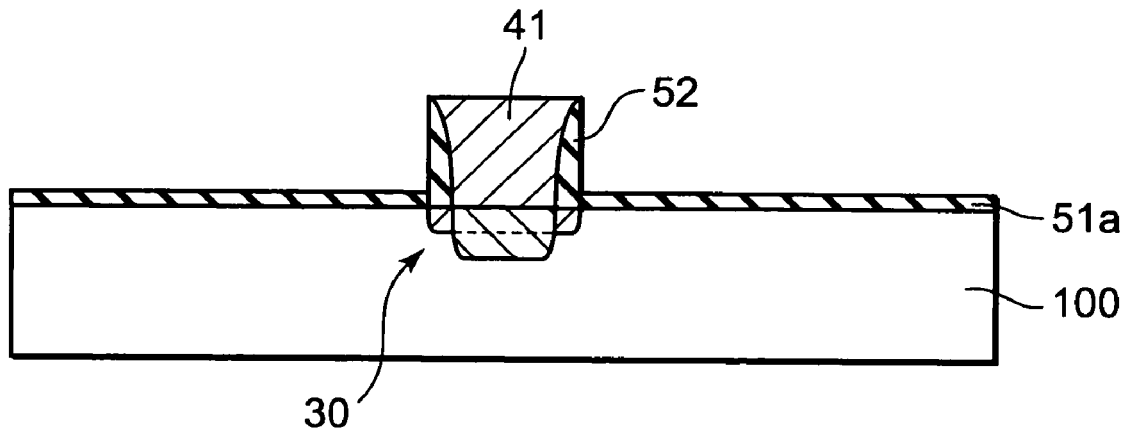
FIG. 9 is still another cross sectional view showing the manufacturing method for the semiconductor device according to the first exemplary embodiment of the present invention.

Then, as shown in FIG. 9, the nitride film 81 is removed by plasma-etching or by wet-etching. Thus a node electrode 41 is formed. In the node electrode 41, the N-type diffusion layer region 30 and the second impurity injection layer 83 are connected directly to each other. After this, impurities are injected into the node electrode 41 to adjust the threshold voltage Vt (not shown).

Figure 10:
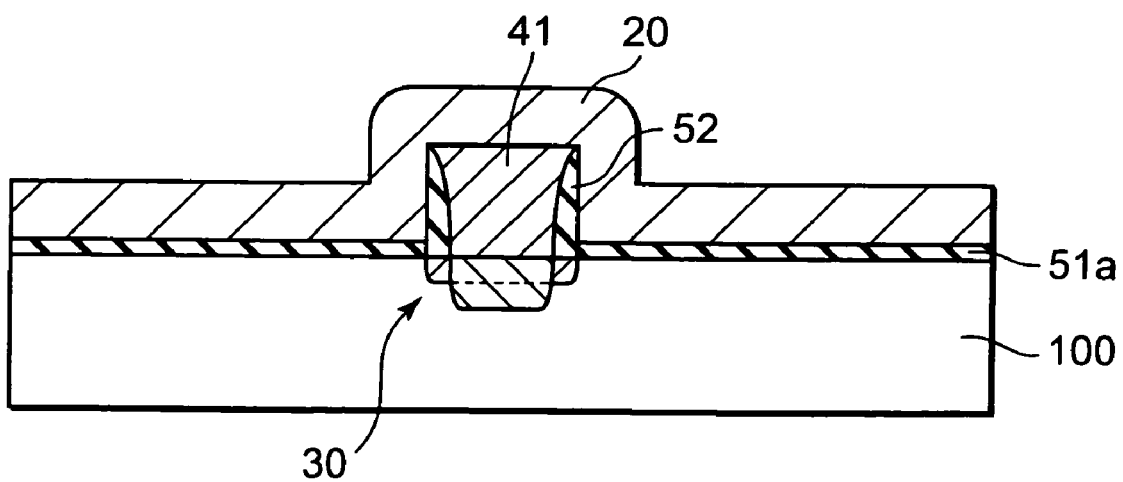
FIG. 10 is still another cross sectional view showing the manufacturing method for the semiconductor device according to the first exemplary embodiment of the present invention.
Figure 11:
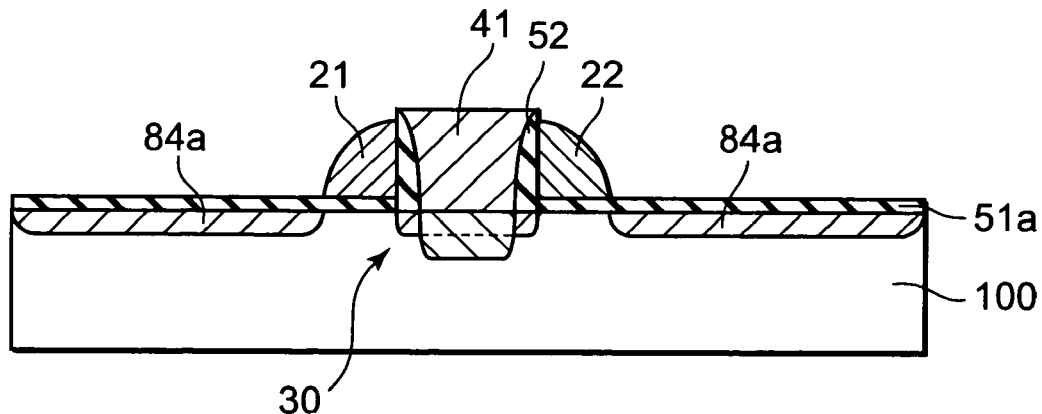
FIG. 11 is still another cross sectional view showing the manufacturing method for the semiconductor device according to the first exemplary embodiment of the present invention.

After this, as shown in FIG. 10, a second polycrystalline silicon film 20 is deposited at a predetermined thickness. Then, as shown in FIG. 11, the second polycrystalline silicon film 20 is etched back by dry-etching. As a result, side wall electrodes, that is, the gate electrodes 21 and 22 are formed with the second polycrystalline silicon film through the side wall insulation film 52 formed on both sides of the node electrode 41 respectively. Under the gate electrodes 21 and 22 is a first insulation film 51a to be assumed as a gate insulation film 51. Then, impurities are injected on the semiconductor substrate through the first insulation film 51a in a self-alignment manner to form a third impurity injection layer 84a.

Figure 12:
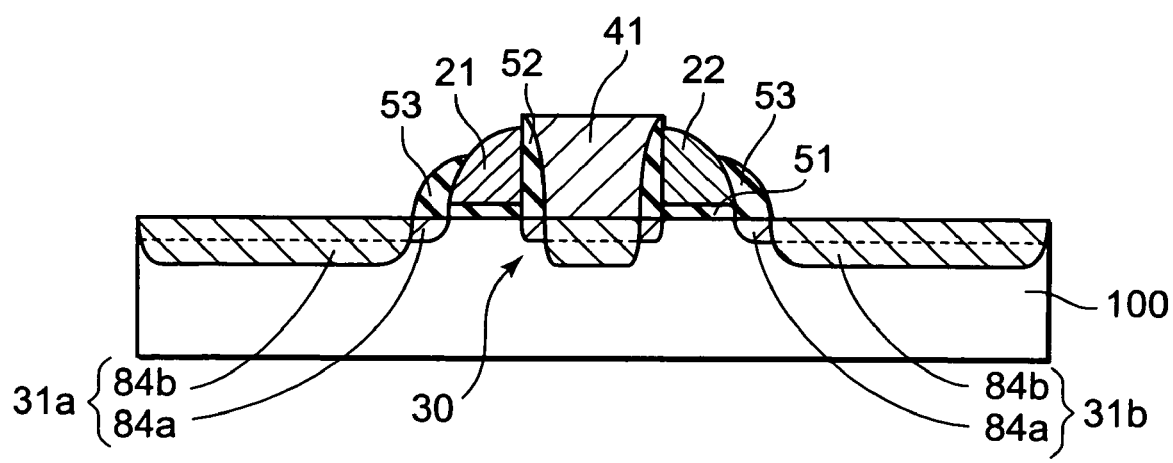
FIG. 12 is still another cross sectional view showing the manufacturing method for the semiconductor device according to the first exemplary embodiment of the present invention.

After this, as shown in FIG. 12, an insulation film (not shown) is deposited on the surface at a predetermined thickness. The insulation film is then etched to form a spacer insulation layer 53 at a side wall outside each of the gate electrodes 21 and 22. Then, impurities are injected through the first insulation film 51 in a self-alignment manner to form a fourth impurity injection layer 84b. Then, the first insulation film 51a on the fourth impurity injection layer 84b is removed by etching. The third and fourth impurity injection layers 84a and 84b constitute N-type diffusion layer regions 31a and 31b respectively.

This completes the description of how to manufacture the semiconductor device in the first exemplary embodiment of the present invention.

The descriptions having been made with respect to the access transistor 5, the driver transistor 2, the node electrode 41, and their related items in the sub-unit block 11 with reference to FIGS. 5 through 12 can also apply to the access transistor 6, the driver transistor 4, the node electrode 42, and their related items in the sub-unit block 12 similarly.

According to the present invention, as described in the semiconductor device manufacturing method above, a pair of gate electrodes (21 and 22) are formed with one node electrode (41 or 42) therebetween in a self-alignment manner. This one node electrode (41 or 42) functions as an electrode to be connected to a common N-type impurity injection layer (30) between two transistors (5 and 2 or 4 and 6). In other words, the node electrode (41 or 42) is related indivisibly to the pair of gate electrodes (21 and 22) formed unitarily and in a self-alignment manner, thereby the node electrode (41 or 42) comes to play a very important role. Consequently, the node electrode (41 or 42) is indispensable; there is no need to eliminate this node electrode (41 or 42). As a result, the pair of gate electrodes (21 and 22) are never isolated without any support in the manufacturing processes, so there will not occur any such problems as gate electrode pattern chipping, pattern falling, etc. in those processes. In addition, after the pair of gate electrodes (21 and 22) is formed, it is not required to eliminate the node electrode (41 or 42). The pair of gate electrodes (21 and 22) can thus be prevented from the increase of occurrence of such problems as insufficient gate length (insufficient width of the gate electrode) and from the variation of the gate length that might be otherwise caused by additional etching to be required in post processes.

According to the present invention, one node electrode (41 or 42) is united with the gate electrodes (21 and 22) of two transistors (5 and 2 or 4 and 6) with a sidewall insulation film (52) therebetween respectively. And under the node electrode (41) is formed a common N-type impurity injection layer (30) connected directly to the node electrode (41). Consequently, there is no need to form any contact hole in the node electrode section. As a result, no dimensional margin is required for the contact hole between the two transistors (5 and 2 or 4 and 6) disposed side by side. The restriction of the semiconductor device in miniaturization is thus minimized. This means that the area of the circuit (SRAM in the first exemplary embodiment) that includes transistors can be more reduced in size.

Generally, SRAM unit cells are designed so that the current driving performance of the access transistor in each cell becomes lower than that of the NMOS transistor (driver transistor) that constitutes the latch circuit. In other words, it is required to adjust the performance ratio (cell ratio) between the access transistor and the driver transistor so as to be set over a predetermined value. However, the cell ratio must be equal to the value of (driver transistor's on current)/(access transistor's on current). Such a cell ratio can be set properly by adjusting the gate length (L) and the gate width (W) of each of the access and driver transistors. In spite of this, it is difficult to avoid occurrence of the dimensional variation among transistors, which is caused by the manufacturing processes. And along with the progress of the miniaturization of those transistors, the dimensional accuracy to be required in the manufacturing processes is getting more and more strict. If the dimensional variation among cell ratio values is large, the cell ratio might go under the predetermined value. In this case, normal reading might not be assured. For example, if the gate length of the access transistor is thinner than the design value and the gate length of the driver transistor becomes thicker than the design value, the cell ratio becomes smaller than the design value. On the contrary, if the gate length of the access transistor is thicker than the design value and the gate length of the driver transistor is thinner than the design value, the cell ratio becomes larger than the design value. If the gate length varies between those two transistors in such a way, the result comes to affect the cell ratio, thereby the cell ratio cannot be fixed and the variation of the gate length between those two transistors becomes larger.

In case of the semiconductor device (SRAM) in the first exemplary embodiment of the present invention, however, the gate electrode (21) of the access transistor (5 or 6) and the gate electrode (22) of the driver transistor (2 or 4) are formed simultaneously at both side walls of the node electrode (41 or 42) that is disposed therebetween. In other words, a pair of gate electrodes (21 and 22) is formed simultaneously at both side walls of the node electrode (41 or 42) that is disposed therebetween in a self-alignment manner. Consequently, those gate electrodes come to be formed very minutely and accurately. In addition, the pair of gate electrodes (21) and (22) formed so as to face each other in a self-alignment manner comes to have the same tendency in the dimensional variation. This is a merit of the semiconductor device in the first exemplary embodiment. As a result, for example, if the gate length of the access transistor (5 or 6) is thicker than the design value, the gate length of the driver transistor (2 or 4)

that faces the access transistor (5 or 6) with the node electrode (41 or 42) therebetween also becomes thicker than the design value. On the contrary, if the gate length of the access transistor (5 or 6) is thinner than the design value, the gate length of the counter part (driver transistor 2 or 4) also becomes thinner than the design value. This is why the cell ratio can be kept at a fixed value in the SRAM unit cell. And this merit makes it possible to adjust the cell ratio only with the difference between diffusion layers in width (gate width of the transistors), thereby the cell ratio never comes to go under the desired design value. Normal reading is thus always assured.

Second Exemplary Embodiment

Next, there will be described a configuration of a semiconductor device in the second exemplary embodiment of the present invention. In the second exemplary embodiment, a SRAM will be picked up as an example of the semiconductor device of the present invention. FIG. 2 is a circuit diagram of the semiconductor device in a configuration employed in the second exemplary embodiment of the present invention. The circuit diagram is the same as that in the first exemplary embodiment, so the description will be omitted here.

Figure 13:
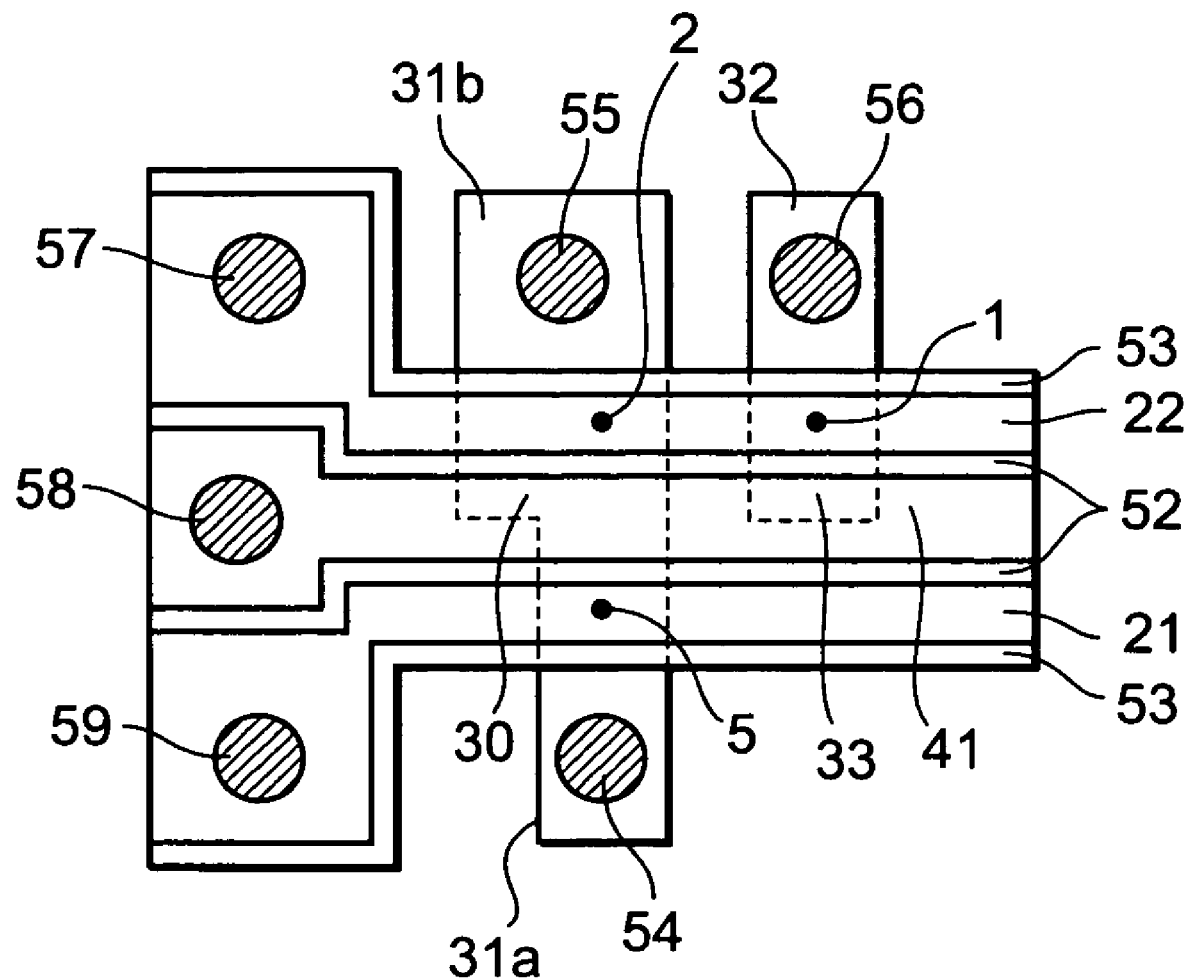
FIG. 13 is a partial top view showing a sub-unit block of a semiconductor device according to a second exemplary embodiment of the present invention.

FIG. 13 is a partial top view of a sub-unit block of the semiconductor device in the configuration employed in the second exemplary embodiment of the present invention. The sub-unit block 11 includes an access transistor 5, a driver transistor 2, a load transistor 1, and a node electrode 41. The access transistor 5 and the driver transistor 2 are the same as those in the first exemplary embodiment (FIG. 3). The load transistor 1 includes a P-type diffusion layer region 32 corresponding to one side of its source-drain electrode, and a P-type diffusion layer region 33 corresponding to the other side of the source-drain electrode. The P-type diffusion layer region 33 is provided under the node electrode 41 that functions as a wiring layer. The gate electrode includes a side wall insulation film 52 on one side wall thereof and a spacer insulation film 53 on the other side wall thereof. The node electrode 41, the gate electrode 22, the side wall insulation film 52, and the spacer insulation film 53 are all common between the load transistor 1 and the driver transistor 2. The load transistor 1 and the driver transistor 2 share the gate electrode 22.

The node electrode 41 (memory node 41) is provided between the gate electrodes 21 and 22 with a side wall insulation film 52 therebetween respectively. The insulation film 52 is formed on both side walls of the node electrode 41 itself. The node electrode 41, which functions as a memory node, is used commonly by the access transistor 5 and the driver transistor 2 as a wiring layer of the N-type diffusion layer region 30 and also used by the load transistor 1 as a wiring layer of the P-type diffusion layer region 33. The node electrode 41 is provided between the gate electrodes 21 and 22 with the side wall insulation film 52 therebetween respectively and those three electrodes are united into one. Under the node electrode 41 is provided an element isolation pattern (not shown), an N-type diffusion layer region 30, and a P-type diffusion layer region 33. The node electrode 41, the N-type diffusion layer region 30, and the P-type diffusion layer region 33 are connected directly to each another with no insulation material therebetween. The N-type diffusion layer region 31$a$ and 31$b$ have contacts 54 and 55 respectively and the P-type diffusion layer region 32 has a contact 56.

The node electrode 41 is extended in a first (longitudinal) direction. At one end portion of the node electrode 41 is formed a node joint of a predetermined size, which has a contact 58 from which an article is to be pulled out. The gate electrode 22 is extended is also extended in the first (longitudinal) direction. And one end of the gate electrode 22 is further extended in a direction (approximately at a right angle to the first direction) so as to be separated from the node joint of the contact 58. The end portion is adjacent to the node joint of the contact 58 and at the end portion is formed a node joint of a predetermined size, which has a contact 57 to be connected with an upper layer. The gate electrode 21 is also extended in the first (longitudinal) direction. And one end of the gate electrode 21 is further extended in a direction (approximately at a right angle to the first direction and in the opposite direction of the gate electrode 22) so as to be separated from the node joint of the contact 58. The end portion is adjacent to the node joint of the contact 58 and at the end portion is formed a node joint of a predetermined size, which has a contact 59 to be connected with an upper layer.

The descriptions made above for the sub-unit block 11 with reference to FIG. 13 can also apply to the sub-unit block 12 similarly.

Figure 14:
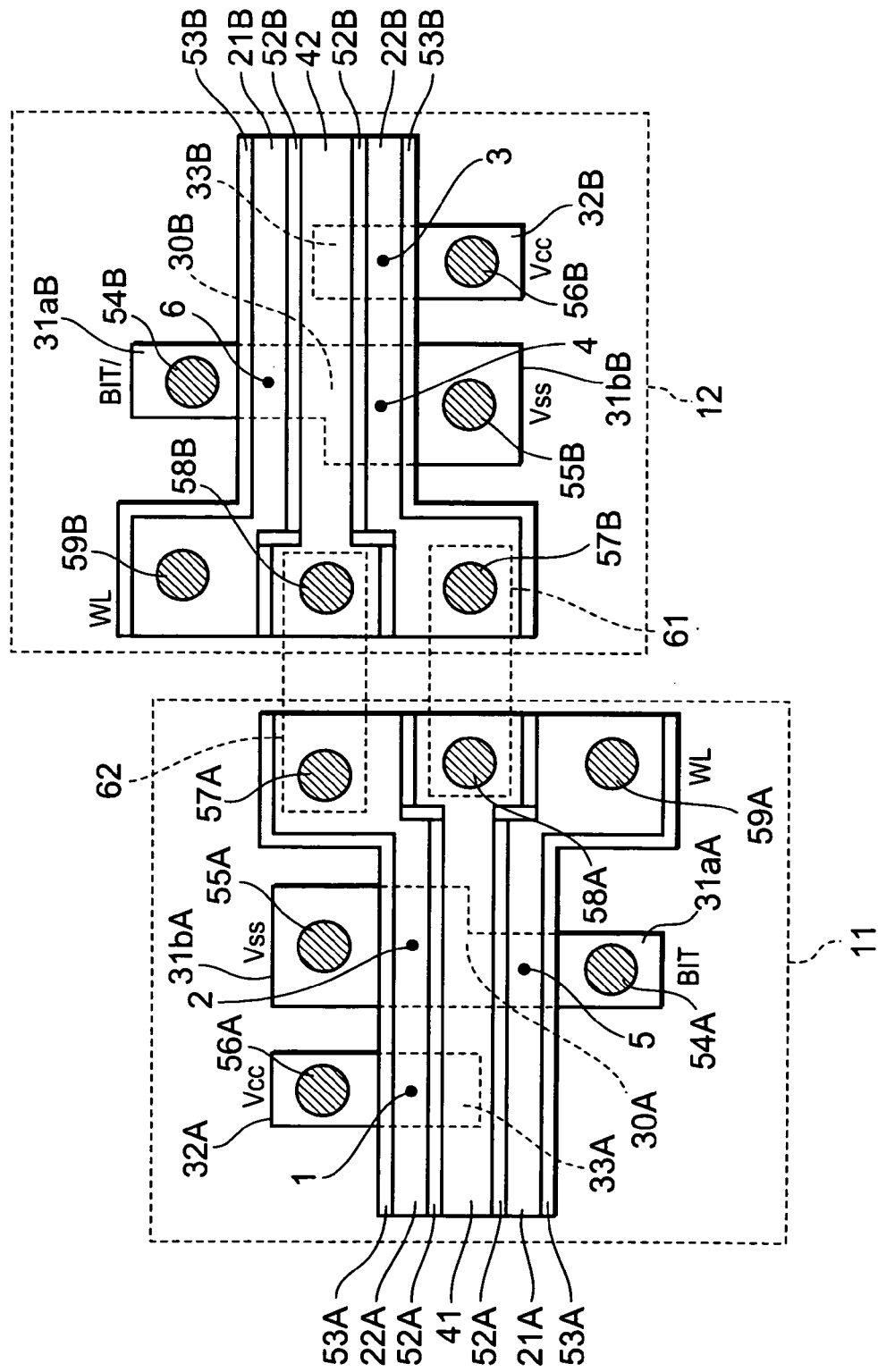
FIG. 14 is a top view showing an example of a SRAM unit cell configured with the sub-unit blocks shown in FIG. 13.

FIG. 14 is a top view of a SRAM unit cell in an example configured with use of the sub-unit block shown in FIG. 13. While "A" is used as a symbol for some items in the sub-unit 11 and "B" for some items in the sub-unit 12 in FIG. 14, both of the sub-units 11 and 12 are the same as those shown in FIG. 13.

In other words, the sub-unit 11 includes an access transistor 5, a driver transistor 2, a load transistor 1, and a node electrode 41. The access transistor 5 includes a gate electrode 21A, an N-type diffusion layer region 31A$a$ corresponding to one side of its source-drain electrode, and an N-type diffusion layer region 30A corresponding to the other side of the source-drain electrode. The driver transistor 2 includes a gate electrode 22A, an N-type diffusion layer region 31$b$A corresponding to one side of its source-drain electrode, and an N-type diffusion layer region 30A corresponding to the other side of the source-drain electrode. The load transistor 1 includes a gate electrode 22A, a P-type diffusion layer region 32A corresponding to one side of its source-drain electrode, and a P-type diffusion layer region 33A corresponding to the other side of the source-drain electrode. Each of the gate electrodes 21A and 22A has a side wall insulation film 52A on one side wall and a spacer insulation film 53A on the other side wall thereof. The node electrode 41 (memory node) is provided between the gate electrodes 21A and 22A with the side wall insulation film 52A therebetween respectively. The insulation film 52A is formed at both side walls of the node electrode 41.

On the other hand, the sub-unit 12 includes an access transistor 6, a driver transistor 4, a load transistor 3, and a node electrode 42. The access transistor 6 includes a gate electrode 21B, an N-type diffusion layer region 31$a$B corresponding to one side of its source-drain electrode, and an N-type diffusion layer region 30B corresponding to the other side of the source-drain electrode. The driver transistor 4 includes a gate electrode 22B, an N-type diffusion layer region 31$b$B corresponding to one side of its source-drain electrode, and an N-type diffusion layer region 30B corresponding to the other side of the source-drain electrode. The load transistor 3 includes a gate electrode 22B, a P-type diffusion layer region 32BA corresponding to one side of its source-drain electrode, and a P-type diffusion layer region 33B corresponding to the other side of the source-drain electrode. Each of the gate electrodes 21B and 22B has a side wall insulation film 52B on one side wall and a spacer insulation film 53B on the other side wall thereof. The node electrode 42 (memory node) is provided between the gate electrodes 21B and 22B with the side wall insulation film 52B therebetween respectively.

Furthermore, the node electrode 41 is extended in the first (longitudinal) direction and its one end portion has a node joint to be connected with the upper layer (contact 58A). The gate electrode 22A is also extended in the first (longitudinal) direction and bent halfway in a direction (approximately at a right angle to the first direction) so as to be separated from the node joint of the contact 58A. The end portion is adjacent to the node joint of the contact 58A and has a node joint to be connected with the upper layer (contact 57A). The gate electrode 21A is also extended in the first (longitudinal) direction and bent halfway in a direction (approximately at a right angle to the first direction and in the opposite direction of the gate electrode 22A) so as to be separated from the node joint of the contact 58A. The end portion is adjacent to the node joint of the contact 58A and has a node joint to be connected with the upper layer (contact 59A).

Furthermore, the node electrode 42 is extended in the first (longitudinal) direction and its one end portion has a node joint to be connected with the upper layer (contact 58B). The gate electrode 22B is also extended in the first (longitudinal) direction and bent halfway in a direction (approximately at a right angle to the first direction) so as to be separated from the node joint of the contact 58B. The end portion is adjacent to the node joint of the contact 58B and has a node joint from which an article is pulled out (contact 57B). The gate electrode 21B is also extended in the first (longitudinal) direction and bent halfway in a direction (approximately at a right angle to the first direction and in the opposite direction of the gate electrode 22B) so as to be separated from the node joint of the contact 58B. The end portion is adjacent to the node joint of the contact 58B and has a word joint from which an article is pulled out (contact 59B).

The SRAM unit cell shown in FIG. 14 is disposed so that the sub-unit blocks 11 and 12 face each other. In this case, the node electrode 42 extended in the first direction is positioned on a line extended in the first direction with respect to the end portion in the gate electrode 22A at the side of the sub-unit block 12. And the node joint (contact 58B) provided at the end portion of the node electrode 42, which faces the sub-unit block 11, is connected to the node joint (contact 57A) provided at the end portion of the gate electrode 22A, which faces the sub-unit block 12 through a wiring layer 62 (e.g., Cu alloy). Similarly, the node electrode 41 extended in the first direction is positioned on a line extended in the direction with respect to the end portion of the gate electrode 22B, which faces the sub-unit block 11. And the node joint (contact 58A) provided at the end portion of the node electrode 41, which faces the sub-unit block 12, is connected to the node joint (contact 57B) provided at the end portion of the gate electrode 22B, which faces the sub-unit block 11, through a wiring layer 61 (e.g., Cu alloy). The wiring layers 62 and 61 are extended in parallel in the first direction. The SRAM unit cell can be formed with the two sub-unit blocks 11 and 12 that are paired and disposed so as to face each other and connected to each other.

Even in the second exemplary embodiment, therefore, occurrence of read errors is suppressed and the cell area is reduced more, thereby assuring the obtainment of the same effects as those in the first exemplary embodiment.

Furthermore, in the second exemplary embodiment, the pull-out portion (contact 58A or 58B) of the node electrode (41 or 42) and the pull-out portion (contact 57B or 57A) of the gate electrode (22B or 22A) are disposed so as to face each other. Consequently, the node electrode (41 or 42) can be connected to the gate electrode (22B or 22A) through the shortest wiring.

Furthermore, in the second exemplary embodiment, the gate electrode (22A or 22B) shared by the driver transistor (2 or 4) and the load transistor (1 or 3) is formed along the node electrode (41 or 42) simultaneously together with the node electrode (41 or 42). Thus the same gate length (corresponding to the width of the gate electrode on the crossing face) can be assured very accurately between the driver transistor (2 or 4) and the load transistor (1 or 3), thereby the manufacturing processes can be simplified.

Third Exemplary Embodiment

Next, there will be described a configuration of a semiconductor device in the third exemplary embodiment of the present invention. In the third exemplary embodiment, an SRAM is used as an example of the semiconductor device in the third exemplary embodiment of the present invention. FIG. 2 is a circuit diagram of the semiconductor device in a configuration employed in the third exemplary embodiment of the present invention. The configuration is the same as that in the first exemplary embodiment, so the description will be omitted here.

Figure 15:
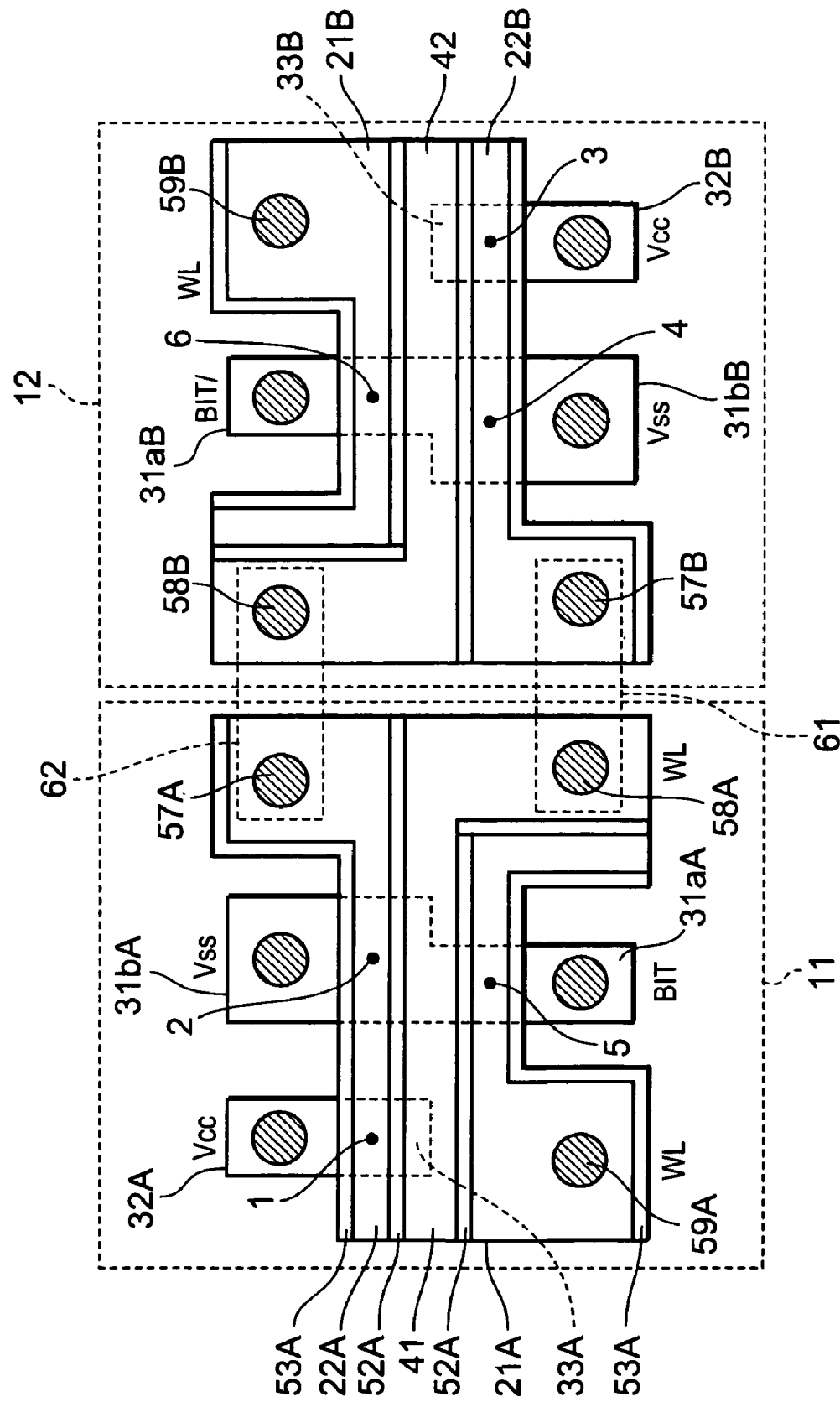
FIG. 15 is a top view of showing a variation of the SRAM unit cell shown in FIG. 14.

FIG. 15 is a top view of the SRAM unit cell in a variation of the example shown in FIG. 14. This variation example differs (from the configuration in the first exemplary embodiment) in that the shape and position of the pull-out portion provided at the end portion of each of the gate and node electrodes are different from those of the SRAM unit cell shown in FIG. 14.

Furthermore, the node electrode 41 is extended in the first (longitudinal) direction and bent halfway in a direction (approximately at a right angle to the first direction) so as to be separated from the gate electrode 22A. The node electrode 41 has an end portion provided with a node joint used as a part to be connected with the upper layer (contact 58A). The gate electrode 22A is also extended in the first (longitudinal) direction and bent halfway in a direction (approximately at a right angle to the first direction and in the opposite direction of the node electrode 41) so as to be separated from the node electrode 41. The end portion is adjacent to the node joint of the contact 58A and has a node joint used as a part to be connected with the upper layer (contact 57A). The gate electrode 21A is extended in the first (longitudinal) direction. Its end portion provided at the opposite side where it is not in contact with the node joint of the contact 58A is bent halfway into a direction (approximately at a right angle to the first direction and in the same direction as that of the node electrode 41) so as to be separated from the node electrode 41. The end portion has a node joint used as a pull-out portion (contact 59A).

Similarly, the node electrode 42 is extended in the first (longitudinal) direction and bent halfway into a direction (approximately at a right angle to the first direction) so as to be separated from the gate electrode 22B. The node electrode 41 has an end portion provided with a node joint used as a part to be connected with the upper layer (contact 58B). The gate electrode 22B is also extended in the first (longitudinal) direction and bent halfway into a direction (approximately at a right angle to the first direction and in the opposite direction of the node electrode 42) so as to be separated from the node electrode 42. The end portion is near the node joint of the contact 58B and has a node joint used as a pull-out portion (contact 57B). The gate electrode 21B is extended in the first (longitudinal) direction. Its end portion provided at the opposite side where it is not in contact with the node joint of the contact 58B is bent halfway into a direction (approximately at a right angle to the first direction and in the same direction as that of the node electrode 42) so as to be separated from the node electrode 42. The end portion has a node joint used as a part to be connected with the upper layer (contact 59B).

The SRAM unit cell shown in FIG. 15 is disposed so that the sub-unit blocks 11 and 12 face to each other. In this case, the node joint (contact 58B) in the node electrode 42 is positioned on a line extended in the first direction with respect to the node joint of the contact 57A in the gate electrode 22A. And the node joint (contact 58B) provided at the end portion of the node electrode 42 closer to the sub-unit block 11 is connected to that (contact 57A) provided at the end portion of the gate electrode 22A closer to the sub-unit block 12 through a wiring layer 62 (e.g., Cu alloy).

Similarly, the node joint of the contact 58A in the node electrode 41 is positioned on a line extended in the first direction with respect to the node joint of the contact 57B in the gate electrode 22B. And the node joint (contact 58A) provided at the end portion of the node electrode 41 closer to the sub-unit block 12 is connected to that (contact 58A) provided at the end portion of the gate electrode 22B closer to the sub-unit block 11 through a wiring layer 61 (e.g., Cu alloy). The wiring layers 62 and 61 are extended in parallel in the first direction. In such a way, the sub-unit blocks 11 and 12 are paired, connected to each other, and disposed so as to face each other to constitute the SRAM unit cell.

Even in the third exemplary embodiment, occurrence of read errors can be suppressed and the cell area can be reduced in size more, thereby assuring the obtainment of the same effects as those in the first exemplary embodiment.

In the third exemplary embodiment, one end portion of the node electrode (41 or 42) is bent so that the SRAM unit cell (sub-units 11 and 12) is disposed in a rectangular shape. As a result, the following benefits are available. At first, because the node electrode (41 or 42) and the gate electrode (22B or 22A) face each other, they can be connected to each other easily. In case of the SRAM unit cell shown in FIG. 14, the sub-unit blocks 11 and 12 are staggered from each other. Thus the wiring above those sub-unit blocks 11 and 12 might be also staggered, thereby the wiring structure might be complicated. On the other hand, in case of the SRAM unit cell in the third exemplary embodiment, the sub-unit blocks 11 and 12 are not staggered, so the wiring to be made above those blocks 11 and 12 can be simplified in structure.

No transistor is formed at the other side of the node electrode (41 or 42) of the load transistor (1 or 3). Consequently the joints (contacts 59A and 59B) of the word line 43 can be formed there. In this case, the mutually connected portions (contacts 57A, 58B, 57B, 58A, and wirings 61 and 62) are never disposed closely to the joints (59A and 59B) of the word line 43. Consequently, it is easy to lay out wirings there.

Next, there will be described how to manufacture the semiconductor device in the third exemplary embodiment of the present invention. FIGS. 16 through 29, as well as FIGS. 30A and 30B are cross sectional and top views of the semiconductor device with respect to its manufacturing method employed in the third exemplary embodiment of the present invention. In case of this manufacturing method, the description of the well 100a is omitted. And in those drawings, the symbols "A" used in the sub-unit block 11 and "B" used in the sub-unit block 12 shown in FIGS. 14 and 15 are omitted. The manufacturing method of this semiconductor device, except for the differences in shape, can also apply to the semiconductor device in the second exemplary embodiment.

Figure 16:
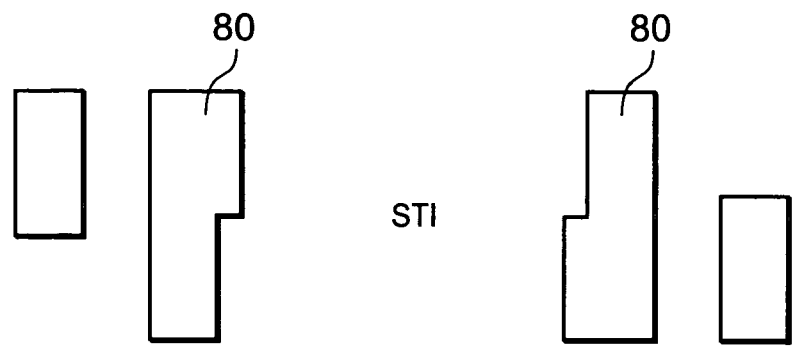
FIG. 16 is a top view showing a manufacturing method for a semiconductor device according to a third exemplary embodiment of the present invention.

At first, as shown in FIG. 16 (top view), an element isolation layer (STI: Shallow Trench Isolation) is formed with a trench insulation film with use of a photo-lithography technique at a predetermined position on the surface of a semiconductor substrate (e.g., silicon substrate). Consequently, a device diffusion layer region 80 comes to be formed there in a predetermined shape.

Figure 17:
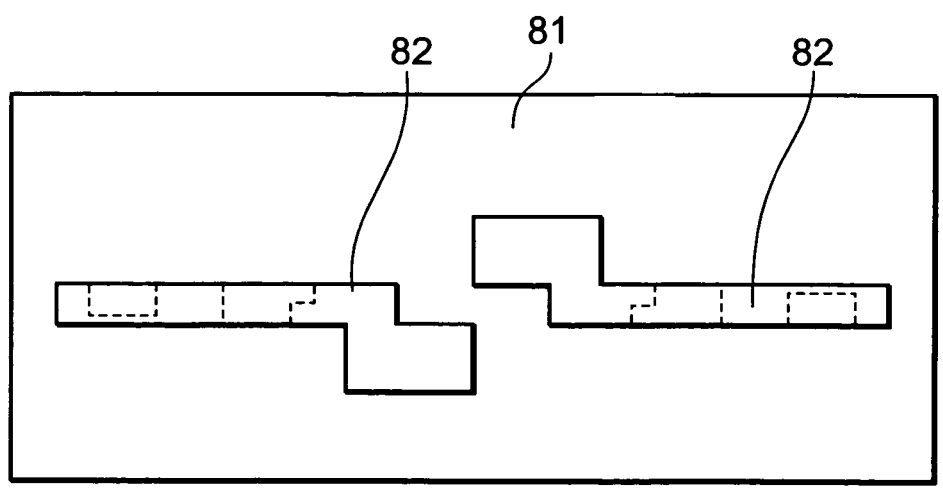
FIG. 17 is another top view showing the manufacturing method for the semiconductor device according to the third exemplary embodiment of the present invention.

Next, as shown in FIG. 17 (top view), a first insulation film 51a (e.g., silicon oxide film) and a nitride film 81 (e.g., silicon nitride film) are deposited at a predetermined thickness respectively on the surface of the semiconductor substrate. After this, the nitride film 81, masked with a photoresist (not shown) having a predetermined shape pattern, is etched to form an opening part 82 in a predetermined shape.

Figure 18:
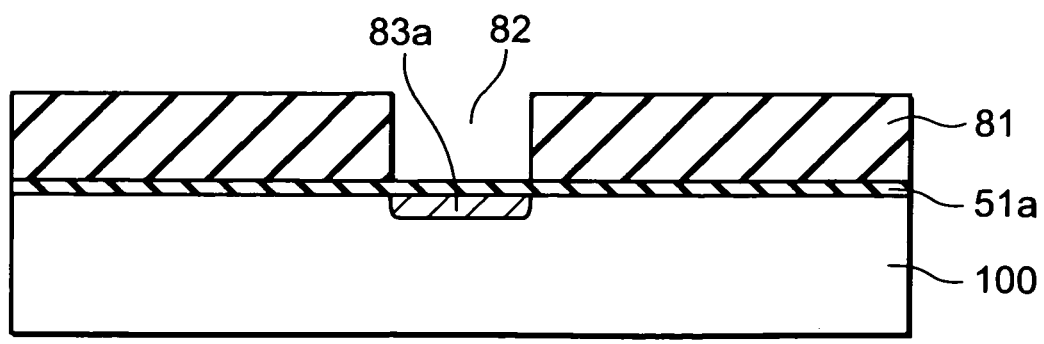
FIG. 18 is a cross sectional view showing the manufacturing method for the semiconductor device according to the third exemplary embodiment of the present invention.

Then, as shown in FIG. 18 (cross sectional view), the opening part 82 is masked with a photoresist and impurities are injected into the opening part 82 through the first insulation film 51a to form a first impurity injection layer 83a. Furthermore, although not shown here, impurities having a conductivity type that is different from that of the first impurity injection layer 83a are injected into the opening part 82 masked with a photoresist having another predetermined shape pattern through the first insulation film 51a to form a P-type diffusion layer region 33 as shown in FIG. 15.

Figure 19:
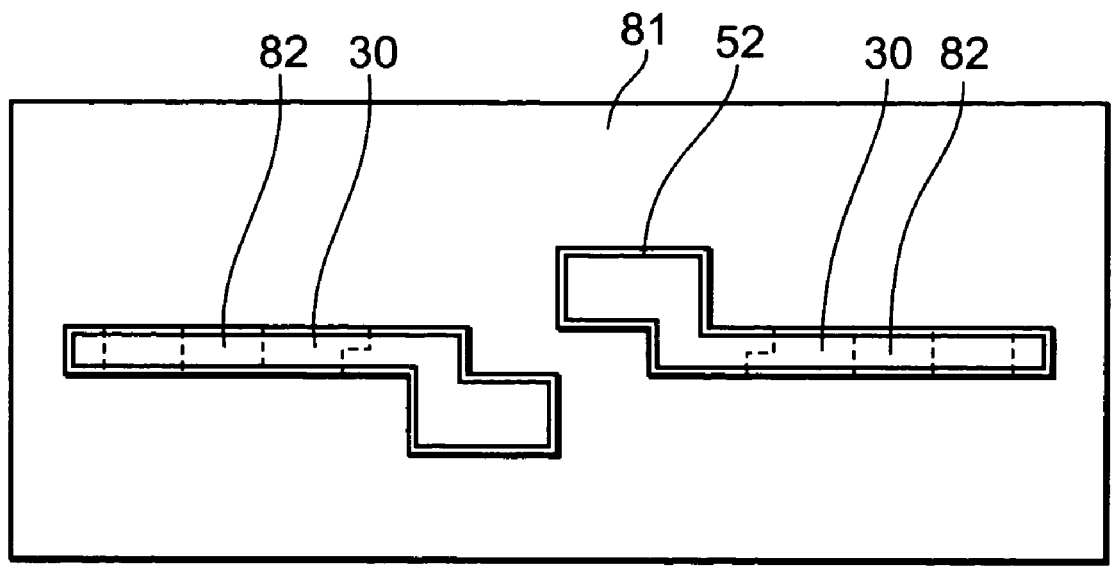
FIG. 19 is still another top view showing the manufacturing method for the semiconductor device according to the third exemplary embodiment of the present invention.

After this, as shown in FIG. 19 (top view), a second insulation film (not shown, e.g., silicon oxide film) is deposited at a predetermined thickness by the CVD method or the like. Then, the second insulation film is etched by dry-etching to form a side wall insulation film 52 in the opening part 82. Then, impurities are injected into the opening part 82 through the first insulation film 51a to form a second impurity injection layer 83b. After this, the first insulation film 51a exposed at the bottom of the opening part 82 is removed by etching. The first and second impurity injection layers 83a and 83b constitute an N-type diffusion layer region 30 respectively.

Figure 20:
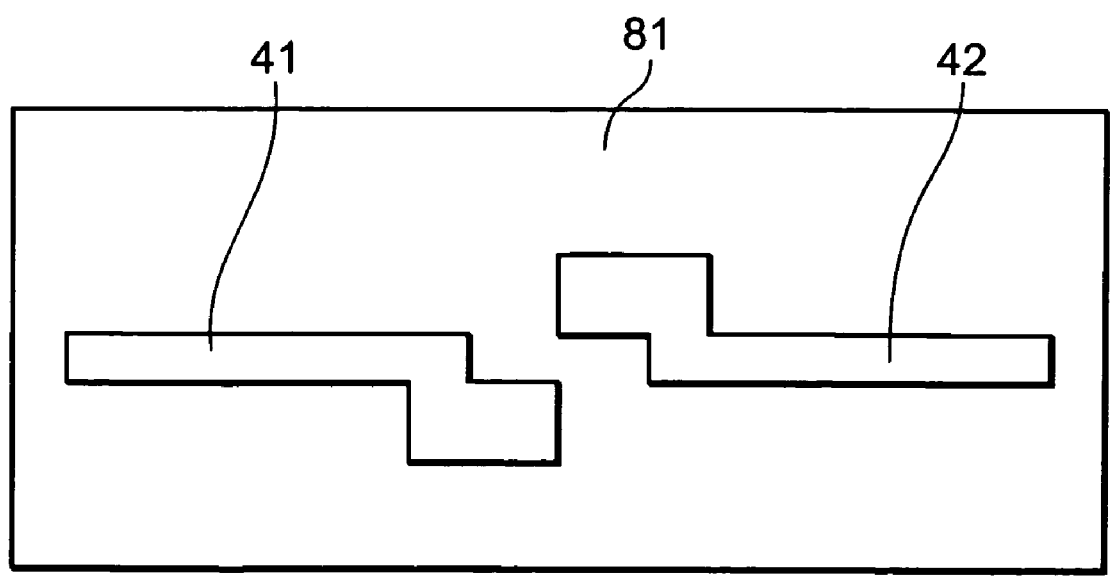
FIG. 20 is still another top view showing the manufacturing method for the semiconductor device according to the third exemplary embodiment of the present invention.
Figure 21:
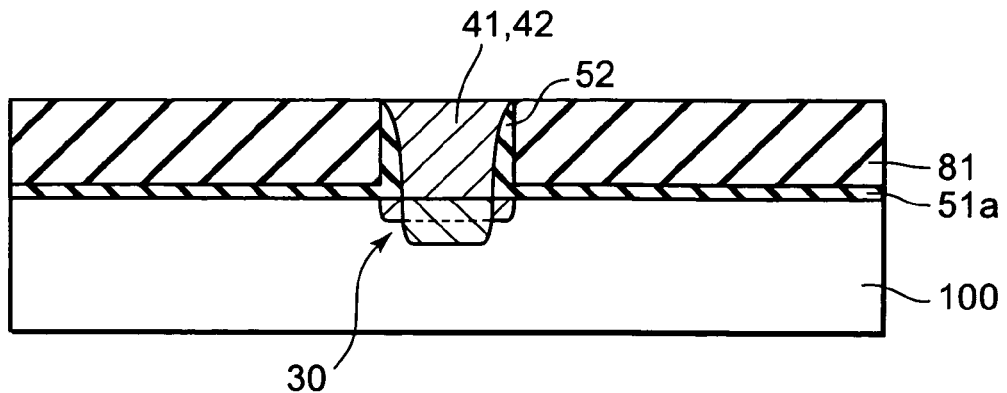
FIG. 21 is another cross sectional view showing the manufacturing method for the semiconductor device according to the third exemplary embodiment of the present invention.

After this, as shown in FIG. 20 (top view), a first polycrystalline silicon film (not shown) is deposited at a predetermined thickness to fill the opening part 82. Then, the surplus first polycrystalline silicon film on the nitride film 81 is etched back and removed by dry-etching. As a result, only the first polycrystalline silicon film (node electrode 41) buried in the opening part 82 is remained. FIG. 21 is a cross sectional view taken on a line of FIG. 20.

Figure 22:
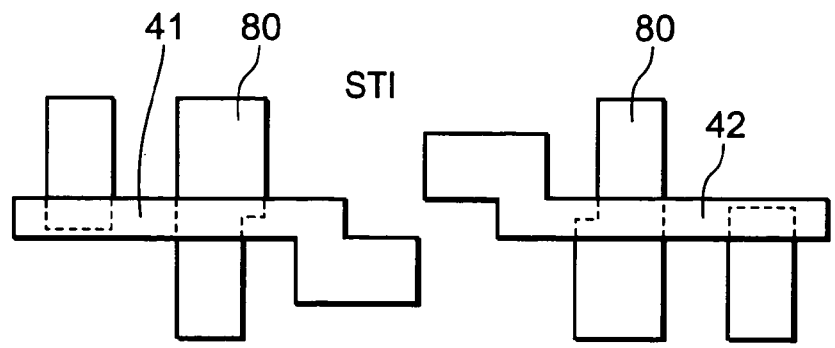
FIG. 22 is still another top view showing the manufacturing method for the semiconductor device according to the third exemplary embodiment of the present invention.
Figure 23:
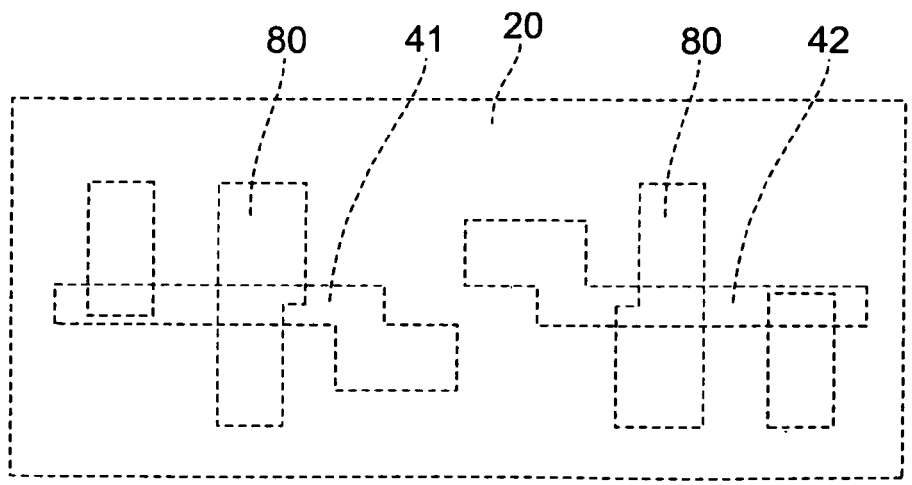
FIG. 23 is still another top view showing the manufacturing method for the semiconductor device according to the third exemplary embodiment of the present invention.
Figure 24:
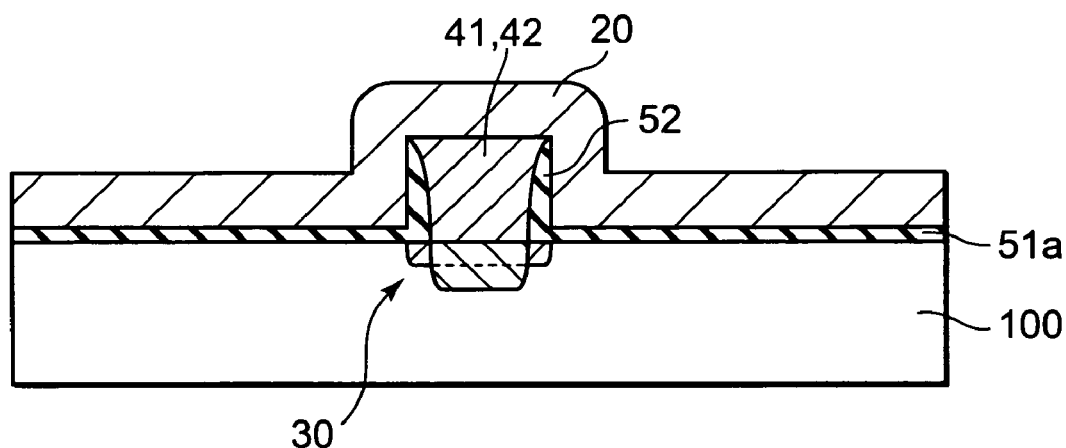
FIG. 24 is still another cross sectional view showing the manufacturing method for the semiconductor device according to the third exemplary embodiment of the present invention.

Next, as shown in FIG. 22 (top view), the nitride film 81 is removed by plasma etching or by wet-etching. Thus the node electrode 41 is formed. The node electrode 41 is directly connected to the second impurity injection layer 83b of the N-type diffusion layer region 30. After this, impurities are injected on the semiconductor substrate to adjust the threshold voltage Vt (not shown). Then, as shown in FIG. 23 (top view), a second polycrystalline silicon film 20 is deposited at a predetermined thickness. FIG. 24 is a cross sectional view taken on line of FIG. 23.

Figure 25:
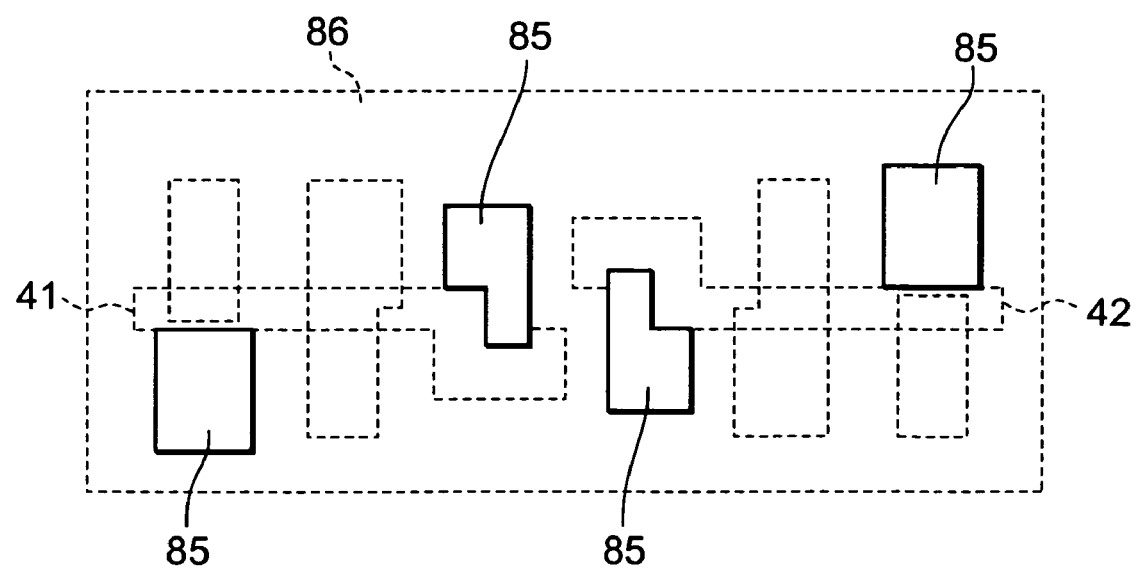
FIG. 25 is still another top view showing the manufacturing method for the semiconductor device according to the third exemplary embodiment of the present invention.

After this, as shown in FIG. 25 (top view), a masking oxide film 86 is formed by the CVD method on the surface of the second polycrystalline silicon film 20. Then, a photoresist 85 is applied all over the surface of the semiconductor substrate. Then, the pattern of the photoresist 85 is remained so as to cover the masking oxide film 86 of stitching portions (pull-out portions of the gate and node electrodes).

Figure 26:
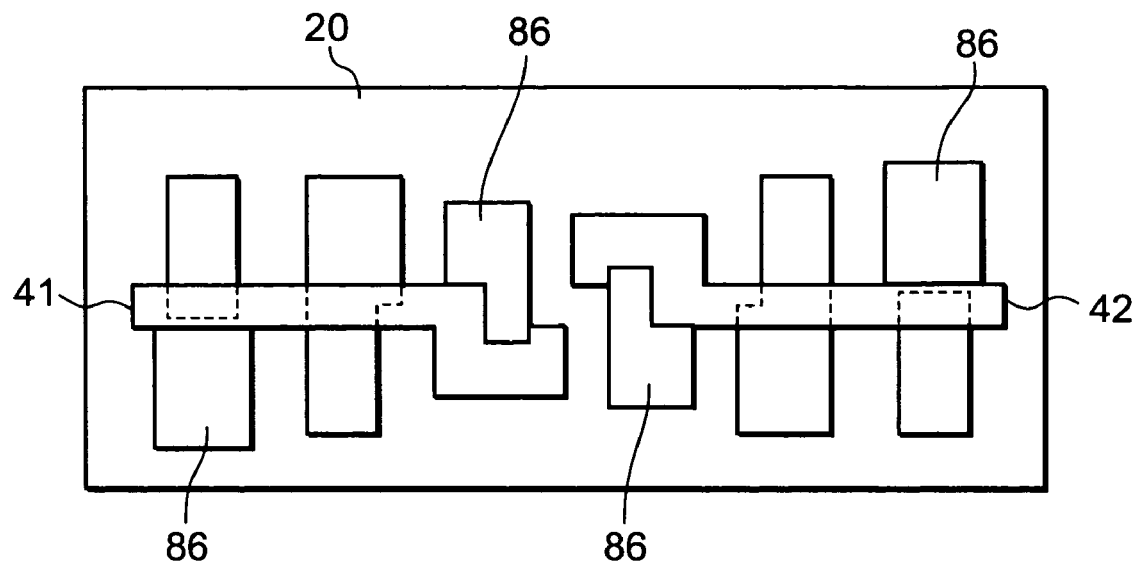
FIG. 26 is still another top view showing the manufacturing method for the semiconductor device according to the third exemplary embodiment of the present invention.

After this, as shown in FIG. 26 (top view), the masking oxide film 86 on the second polycrystalline silicon film 20 is removed by wet-etching. After this, the photoresist 85 is removed. As a result, only the masking oxide film 86 is remained at the switching portion on the second polycrystalline silicon film 20.

Figure 27:
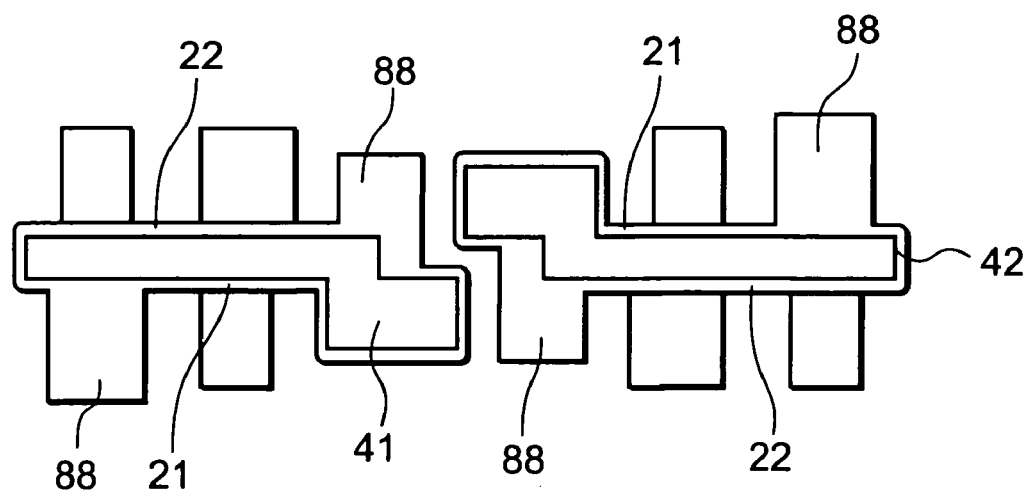
FIG. 27 is still another top view showing the manufacturing method for the semiconductor device according to the third exemplary embodiment of the present invention.
Figure 28:
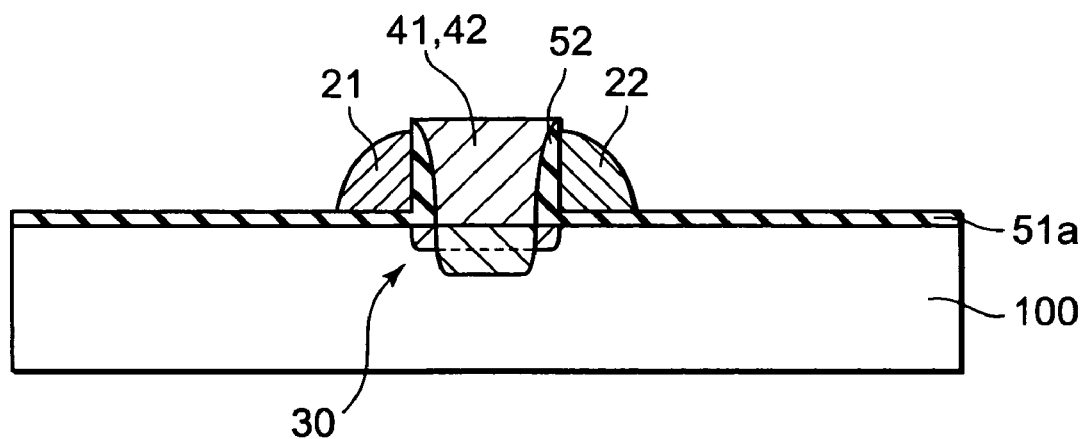
FIG. 28 is still another cross sectional view showing the manufacturing method for the semiconductor device according to the third exemplary embodiment of the present invention.

Then, as shown in FIG. 27 (top view), the second polycrystalline silicon film 20 is etched back by dry-etching. As a result, side wall electrodes, that is, the gate electrodes 21 and 22 come to be formed with the second polycrystalline silicon film separately at both side walls of the node electrode 41 through a side wall insulation film 52 respectively. At the same time, a stitching portion 88 is formed at the place protected by the masking oxide film 86. FIG. 28 is a cross sectional view taken on a line of FIG. 27. And under the gate electrodes 21 and 22 is formed the first insulation film 51*a* to be assumed as a gate insulation film 51.

Figure 29:
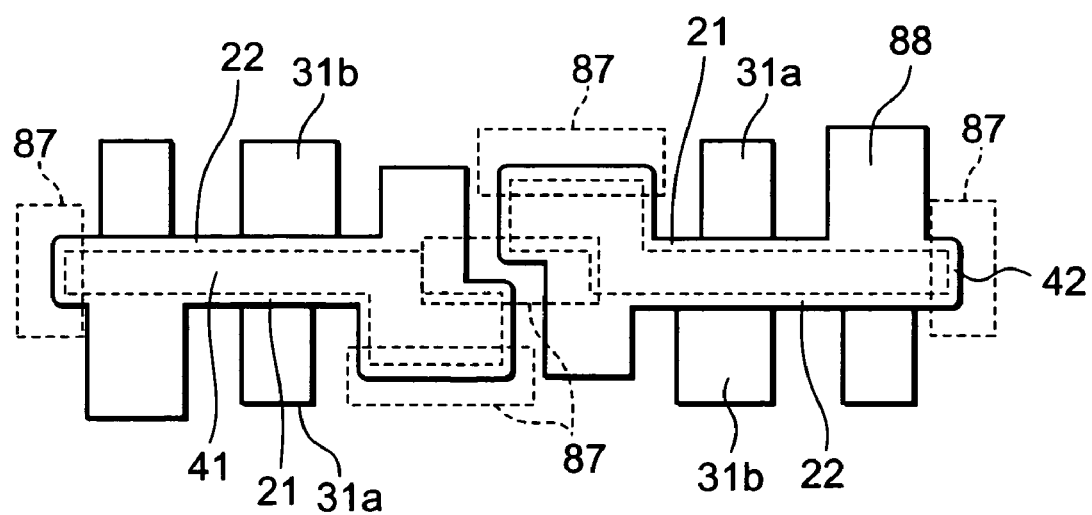
FIG. 29 is still another top view showing the manufacturing method for the semiconductor device according to the third exemplary embodiment of the present invention.
Figure 30A:
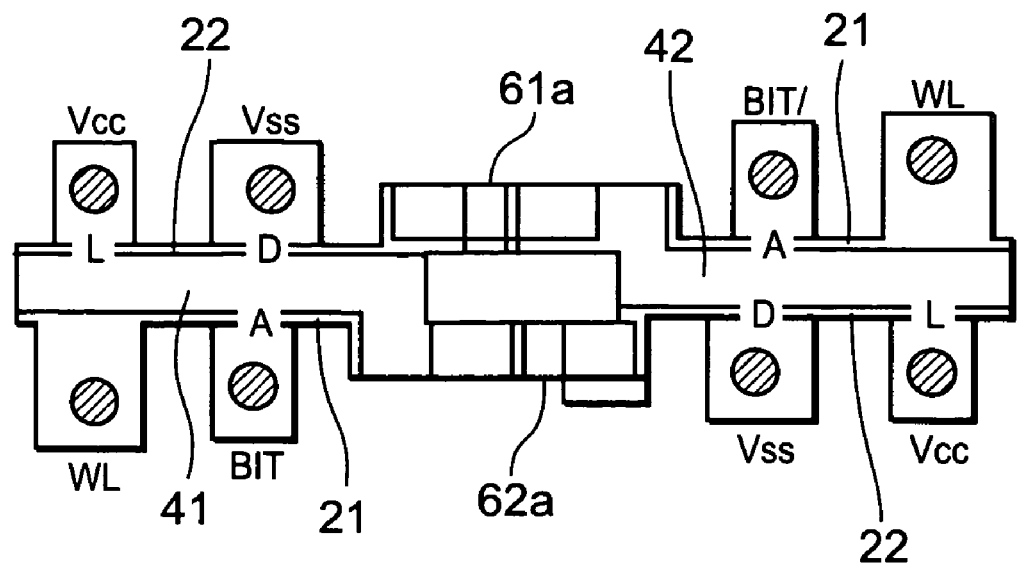
FIG. 30A is still another top view showing the manufacturing method for the semiconductor device according to the third exemplary embodiment of the present invention.
Figure 30B:
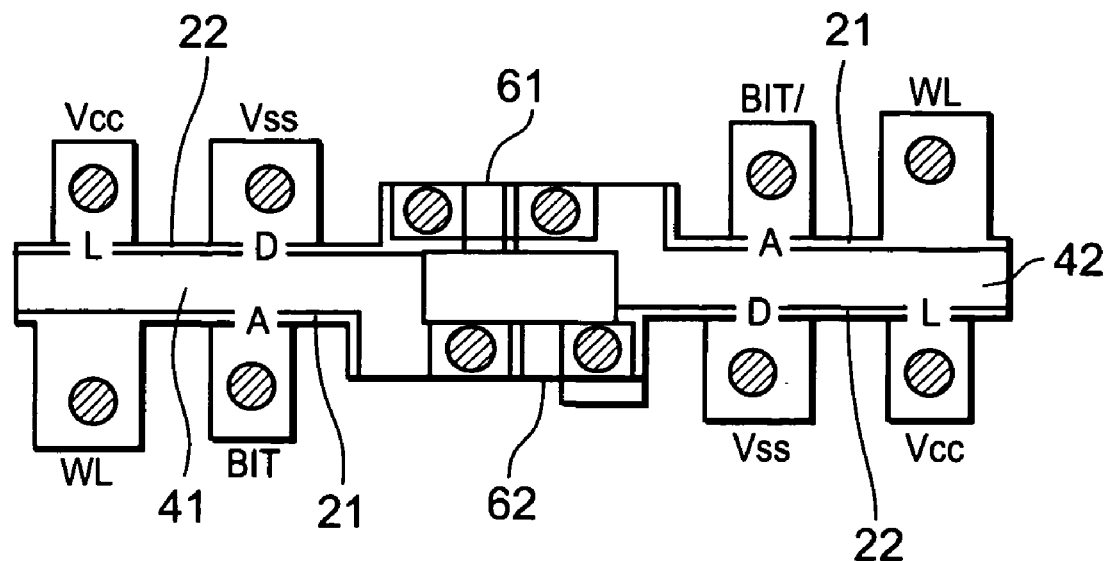
FIG. 30B is still another top view showing the manufacturing method for the semiconductor device according to the third exemplary embodiment of the present invention.

Next, as shown in FIG. 29 (top view), impurities are injected into a region where an N-type diffusion layer region 31 is to be formed, through the first insulation film 51*a* in a self-alignment manner to form a third impurity injection layer (84*a*: not shown). On the other hand, although not shown here, impurities are also injected into a region where a P-type diffusion layer region 32 is to be formed, through the first insulation film 51*a* in a self-alignment manner to form part of the P-type diffusion layer region 32 as shown in FIG. 15. The conductivity type of the injected impurities is different from that of the third impurity injection layer 84*a*. Then, an insulation film (not shown) is deposited at a predetermined thickness, then the film is etched to form a spacer insulation film (53: not shown) at a side wall outside each of the gate electrodes 21 and 22. After this, impurities are injected into a region where an N-type diffusion layer region 31 is to be formed, through the first insulation film 51*a* in a self-alignment manner to form a fourth impurity injection layer (84*b*: not shown). On the other hand, although not shown here, impurities are also injected into a region where a P-type diffusion layer region 32 is to be formed, through the first insulation film 51*a* in a self-alignment manner to form a P-type diffusion layer region 32 as shown in FIG. 15. The conductivity type of these impurities is different from that of the fourth impurity injection layer 84*b*. After this, the first insulation film 51*a* provided on the fourth impurity injection layer (84*b*) and the P-type diffusion layer region 32 is removed by etching. This third impurity injection layer (84*a*) and the fourth impurity injection layer (84*b*) constitute the N-type diffusion layer regions 31*a* and 31*b* respectively. Then, a masking pattern (not shown) is formed with a photoresist. The masking pattern includes an opening part 87 that includes unnecessary portions of the gate electrodes 21 and 22. Then, those unnecessary portions are removed by dry-etching. Consequently, the gate electrode 21 is separated from the gate electrode 22. After this, the masking pattern is removed by etching.

After this, a silicide process and an interlayer film forming process are carried out (not shown), then a contact hole is formed in a shape (e.g., a rectangle in case of FIG. 30A) that crosses the two electrodes, that is, the node electrode 41 and the gate electrode 22 that are paired and disposed to face each other. Then, the contact hole is filled with such a conductor material as metal to form a wiring 62*a*. The wiring 62*a* connects the stitching portion (node joint) of the node electrode 41 to that (node joint) of the gate electrode 22. Similarly, a contact hole is formed in a shape (e.g., a rectangle in case of FIG. 30A) that crosses the two electrodes, that is, the node electrode 42 and the gate electrode 22 that are paired and disposed to face each other, then the contact hole is filled with such a conductor material as metal to form a wiring 61*a*. The wiring 61*a* connects the stitching portion (node joint) of the node electrode 42 to that (node joint) of the gate electrode 22. Otherwise, as shown in FIG. 30B (top view), a contact and metal wiring assumed as a wiring layer 61 are used to connect the stitching portion (node joint) of the node electrode 42 to that (node joint) of the gate electrode 22. As described above, the node electrode 42 and the gate electrode 22 are paired and disposed to face each other.

This completes the description of how to manufacture the semiconductor device in the third exemplary embodiment.

As for the load transistor, the driver transistor, and the access transistor used for the SRAM unit cell in each of the first to the third exemplary embodiments described above, there are many variations in their dispositions. Hereunder, the merits of those variations will be described.

Figure 31:
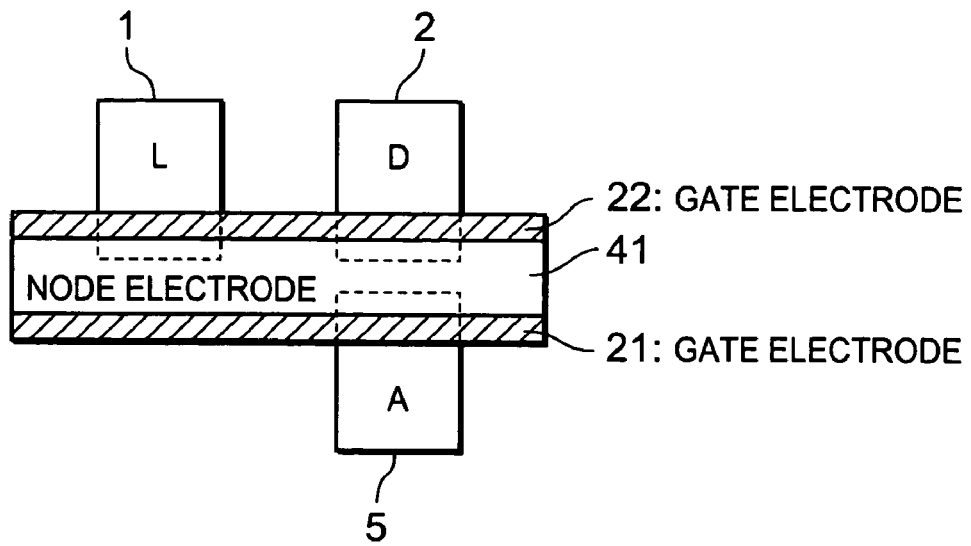
FIG. 31 is a schematic view showing an example of each transistor disposed in the semiconductor device in each exemplary embodiment of the present invention.

FIG. 31 is a schematic view of each transistor disposed in an example in the semiconductor device of each exemplary embodiment of the present invention described above. In this FIG. 31 is shown a positional relationship among the load transistor (L) 1 (or 3), the driver transistor (D) 2, (or 4), and the access transistor (A) 5 (pr6) with respect to the node electrode 41 (or 42) provided in the semiconductor device shown in FIGS. 13 through 15 respectively. In FIGS. 31 through 36, although each transistor is denoted as a rectangle that includes dotted lines so as to be understood easily, the rectangle just denotes a positional relationship among those transistors; it does not denote the actual shape of each transistor. The transistors are disposed as shown in FIG. 31 with respect to the object node electrode. This disposition is the same as that shown in each of the second and the third exemplary embodiments. And this disposition makes it possible to obtain the following merits.

At first, in case of this disposition, because each transistor gate electrode is formed as a side wall of a node electrode, the load transistor (L), the driver transistor (D), and the access transistor (A) can be matched very accurately in gate length and those transistors come to have the same tendency in dimensional variation. Consequently, the disposition can solve the above-described problems of the cell ratio between the driver transistor (D) and the access transistor (A). In addition, the SRAM unit cell area can be reduced. Furthermore, if a plurality of SRAM unit cells are arranged side by side on a plane, the N-type diffusion layer region and the P-type diffusion layer region are disposed alternately in a band pattern. Thus the diffusion layer layout can be simplified. Furthermore, because the load transistor (L), the driver transistor (D), and the access transistor (A) share a node electrode commonly, a sub-unit block (having a space equivalent to three transistors) of the SRAM unit cell can be fit in one node electrode, thereby the space can also be reduced. Furthermore, because the load transistor (L) and the driver transistor (D) share a gate electrode and a node electrode commonly, they may be disposed unitarily at the same side and they may be prevented from gate length variation and enabled to reduce the area more.

Figure 32A:
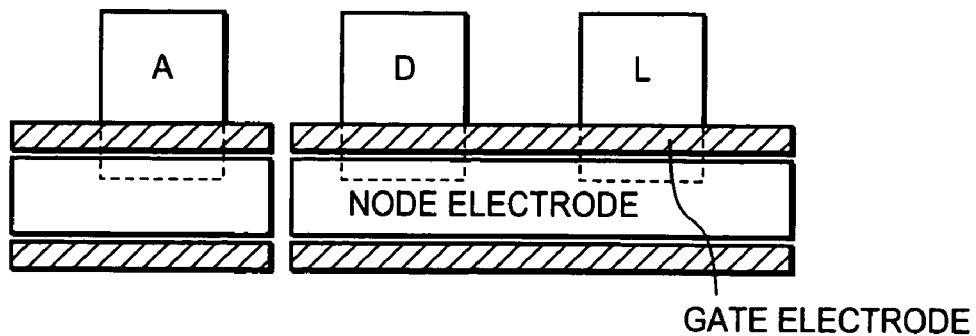
FIG. 32A is a schematic view showing a variation of each transistor disposed in the semiconductor device in each exemplary embodiment of the present invention.
Figure 32B:
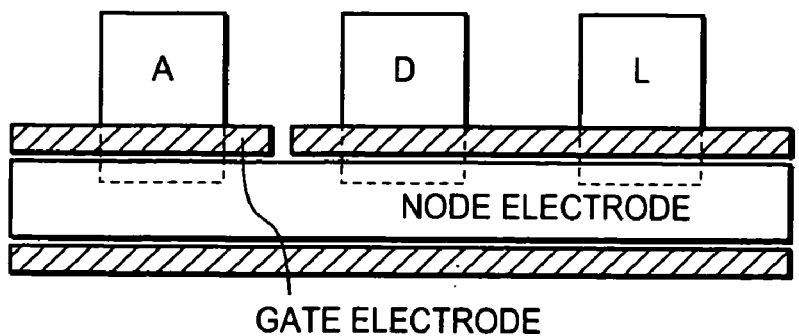
FIG. 32B is another schematic view showing the variation of each transistor disposed in the semiconductor device in each exemplary embodiment of the present invention.

FIGS. 32A and 32B are schematic views of each transistor disposed in a variation layout in the semiconductor device of each exemplary embodiment of the present invention. In these drawings, the load transistor (L), the driver transistor (D), and the access transistor (A) are disposed side by side at one side with respect to the object node electrode. However, because the driver transistor (D) and the access transistor (A) cannot share a gate electrode, it is required that at least the gate electrode is divided between those two transistors (D) and (A). FIG. 32A shows such a case in which the gate electrode and the node electrode are separated. For example, the gate electrode is separated after it is formed, then they are connected to the node electrode again in a separate process. FIG. 32B shows a case in which only the gate electrode is separated. When each transistor is disposed in such a way with respect to the node electrode, the gate electrode can be shared among those transistors. This is why the load transistor (L), the driver transistor (D), and the access transistor (A) can be matched very accurately in gate length. In this example, the portion in which the gate electrode might otherwise be disposed at the side where the transistors (L, D, and A) are not disposed is not used as a gate electrode.

Figure 33:
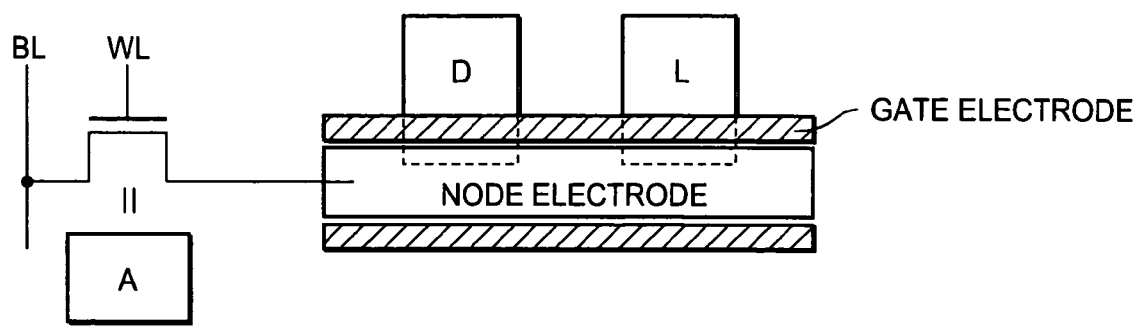
FIG. 33 is still another schematic view showing the variation of each transistor disposed in the semiconductor device in each exemplary embodiment of the present invention.

FIG. 33 is a schematic view of each transistor disposed in each of the above described exemplary embodiment of the present invention in a variation example. In FIG. 33, the load transistor (L) and the driver transistor (D) are disposed at the same side with respect to the object node electrode while the access transistor (A) is disposed in another position. When each transistor is disposed in such a way with respect to the node electrode, those transistors come to share the gate electrode commonly. Thus the load transistor (L) and the driver transistor (D) can be matched very accurately in gate length. In this case, the portion in which the gate electrode might otherwise be disposed at the side where the transistors (L and D) are not disposed is not used as a gate electrode.

Figure 34:
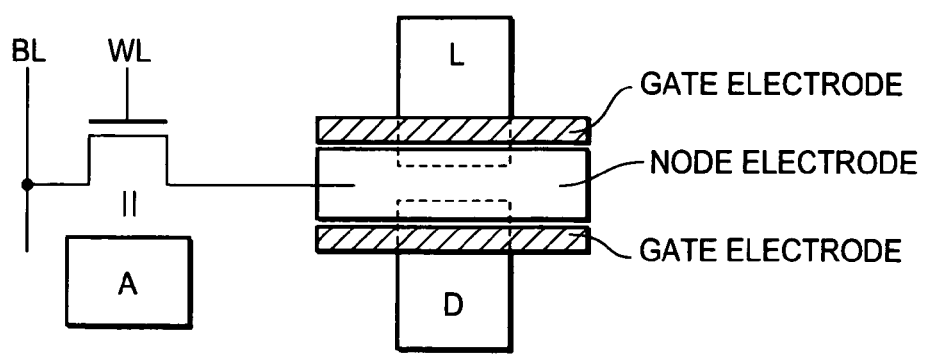
FIG. 34 is still another schematic view showing the variation of each transistor disposed in the semiconductor device in each exemplary embodiment of the present invention.

FIG. 34 is a schematic view of each transistor disposed in each of the above-described exemplary embodiments of the present invention in another variation example. In FIG. 34, the load transistor (L) and the driver transistor (D) are disposed so as to face each other with respect to the object node electrode while the access transistor (A) is disposed in another place. When each transistor is disposed in such a way with respect to the node electrode, the gate electrode of each transistor is formed as a side wall of the node electrode. Thus two transistors can be disposed in a smaller area, thereby the whole transistor area can be reduced in size.

Figure 35A:
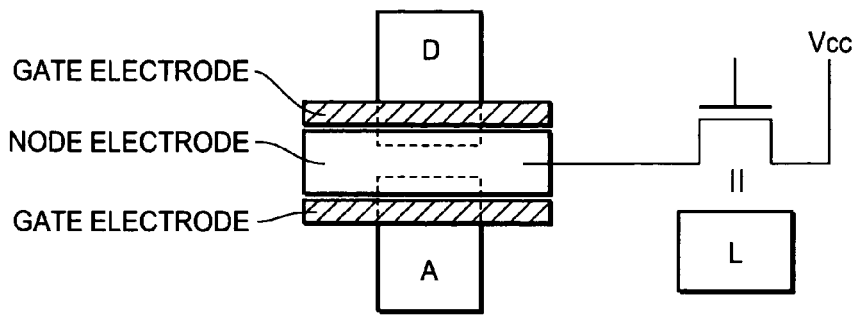
FIG. 35A is still another schematic view showing the variation of each transistor disposed in the semiconductor device in each exemplary embodiment of the present invention.
Figure 35B:
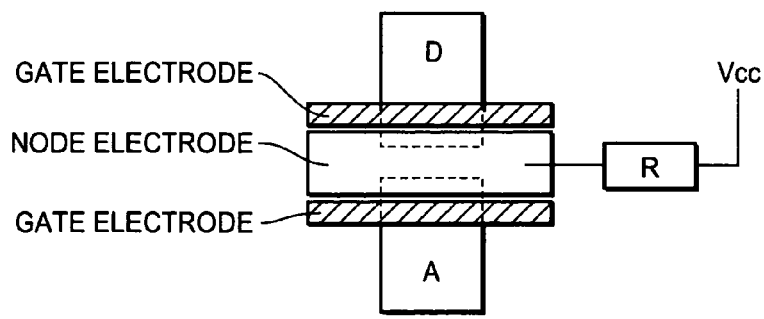
FIG. 35B is still another schematic view showing the variation of each transistor disposed in the semiconductor device in each exemplary embodiment of the present invention.
Figure 35C:
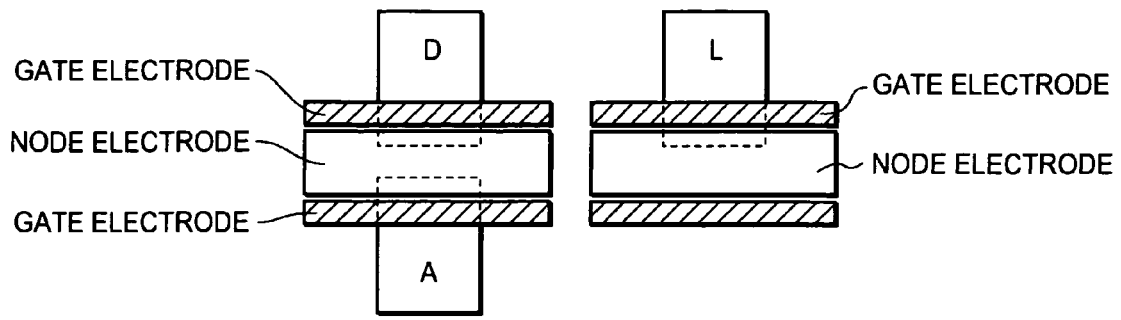
FIG. 35C is still another schematic view showing the variation of each transistor disposed in the semiconductor device in each exemplary embodiment of the present invention.

FIGS. 35A through 35C are schematic views of each transistor disposed in each of the above-described exemplary embodiments of the present invention in still another variation example. In FIG. 35A, the access transistor (A) and the driver transistor (D) are disposed so as to face each other with respect to the object node electrode while the load transistor (D) is disposed in another place. In FIG. 35B, the load transistor (L) is replaced with a resistor R. And in FIG. 35C, the load transistor (D) is disposed as a component of the semiconductor device of the present invention. The disposition of those transistors in FIGS. 35A and 35B is the same as that in the first exemplary embodiment. In this case, the driver transistor (D) and the access transistor (A) can be matched very accurately in gate length and can have the same tendency in dimensional variation. Consequently, this disposition can solve the above-described problems of the cell ratio between the driver transistor (D) and the access transistor (A). Furthermore, the SRAM unit cell area can be reduced. In FIG. 35C, the portion in which the gate electrode might otherwise be disposed at the side where the load transistor (L) is not disposed is not used as a gate electrode.

Figure 36:
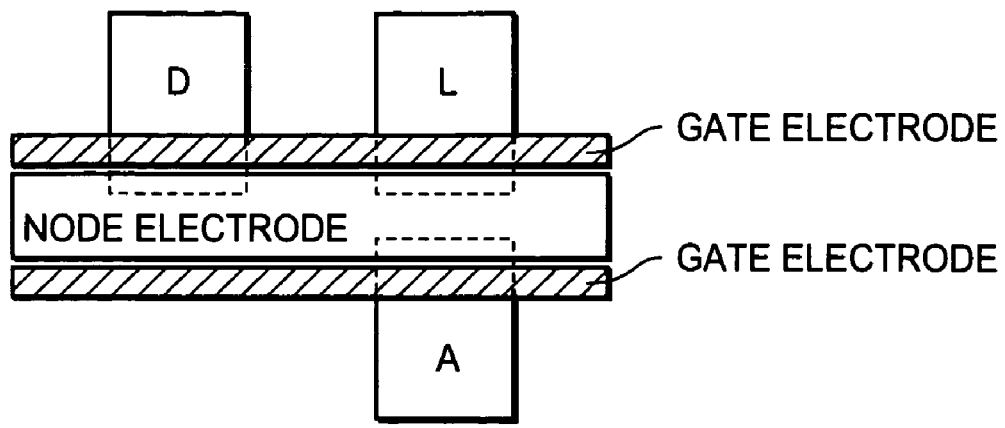
FIG. 36 is still another schematic view showing the variation of each transistor disposed in the semiconductor device in each exemplary embodiment of the present invention.

FIG. 36 is a schematic view of each transistor disposed in each of the above-described exemplary embodiments of the present invention in still another variation example. In FIG. 36, the load transistor (L) and the driver transistor (D) are disposed side by side at the same side with respect to the object node electrode while the access transistor (A) is disposed in another place. When each transistor is disposed in such a way with respect to the node electrode, the same effect as that in FIG. 31 can be obtained. And as described above, the layout of each transistor of the present invention is not limited only to the case in which the access transistor (A) and the driver transistor (D) are disposed so as to face each other as shown in FIG. 31.

Fourth Exemplary Embodiment

Figure 37:
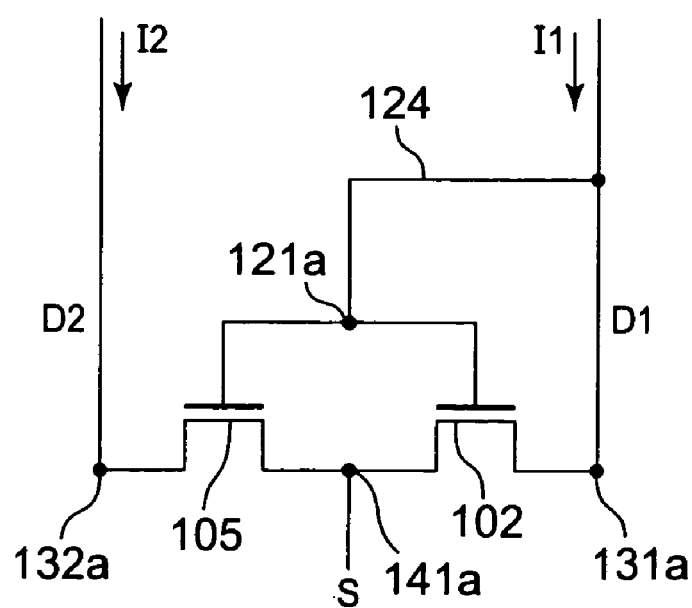
FIG. 37 is a circuit diagram showing a configuration of a semiconductor device according to a fourth exemplary embodiment of the present invention.

At first, there will be described a configuration of a semiconductor device in the fourth exemplary embodiment of the present invention. In the fourth exemplary embodiment, a current mirror circuit is used as an example of the semiconductor device of the present invention. FIG. 37 is a circuit diagram of the semiconductor device in a configuration employed in the fourth exemplary embodiment of the present invention. Two MOS transistors (102 and 105) are included in the semiconductor device.

In the transistor 102, one side of its source-drain electrode is connected to a node 141a, the other side thereof is connected to a node 131a (drain side), and its gate electrode is connected to a node 121a respectively. The node 121a is connected to the node 131a through a wiring 124. On the other hand, in the transistor 105, one side of its source-drain electrode is connected to a node 141a (source side), the other side thereof is connected to a node 132a (drain side), and its gate electrode is connected to a node 121a respectively.

Figure 38:
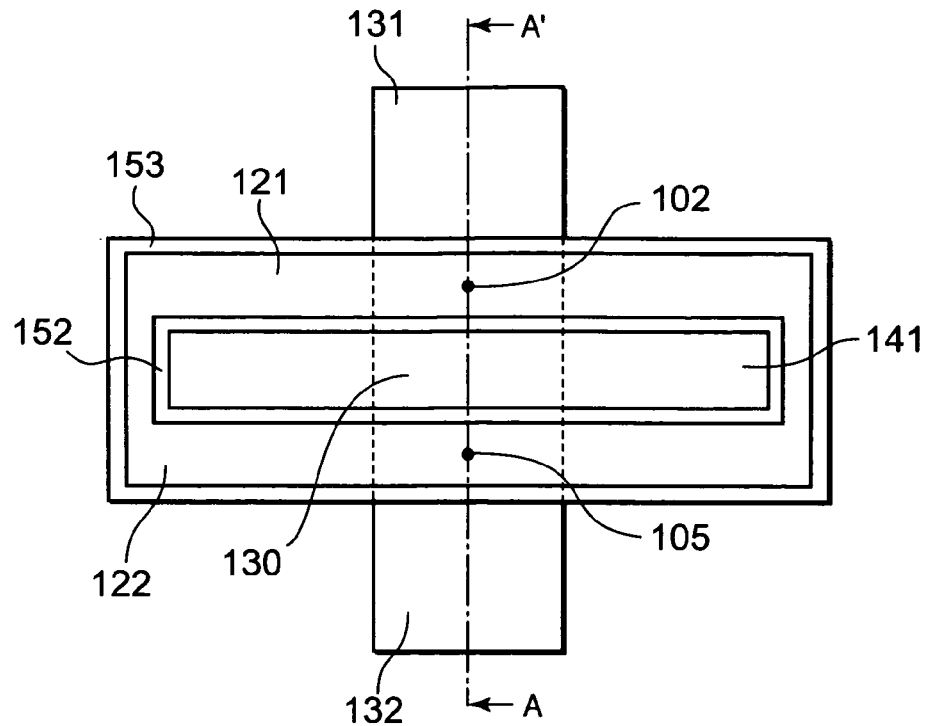
FIG. 38 is a partial top view showing a configuration of a semiconductor device according to the fourth exemplary embodiment of the present invention.

FIG. 38 is a partial top view of the semiconductor device in the configuration employed in the fourth exemplary embodiment of the present invention. In the current mirror circuit, the transistor 102 includes a gate electrode 121, an N-type diffusion layer region 131 corresponding to one side of its source-drain electrode, and an N-type diffusion layer region 130 corresponding to the other side of the source-drain electrode. The N-type diffusion layer region 130 is provided under a common source electrode 141 as a wiring layer. The gate electrode 121 includes a side wall insulation film 152 on one side wall and a spacer insulation film 153 on the other side wall thereof.

On the other hand, the transistor 105 includes a gate electrode 122, an N-type diffusion layer region 132 corresponding to one side of its source-drain electrode, and an N-type diffusion layer region 130 corresponding to the other side of the source-drain electrode. The gate electrode 122 is connected to the gate electrode 121 electrically. This means that the gate electrode 121 and the gate electrode 122 are provided so as to surround the common source electrode 141. The N-type diffusion layer region 130 is the same as that of the transistor 102. The gate electrode 122 includes a side wall insulation film 152 on one side wall and a spacer insulation film 153 on the other side wall thereof.

Figure 39:
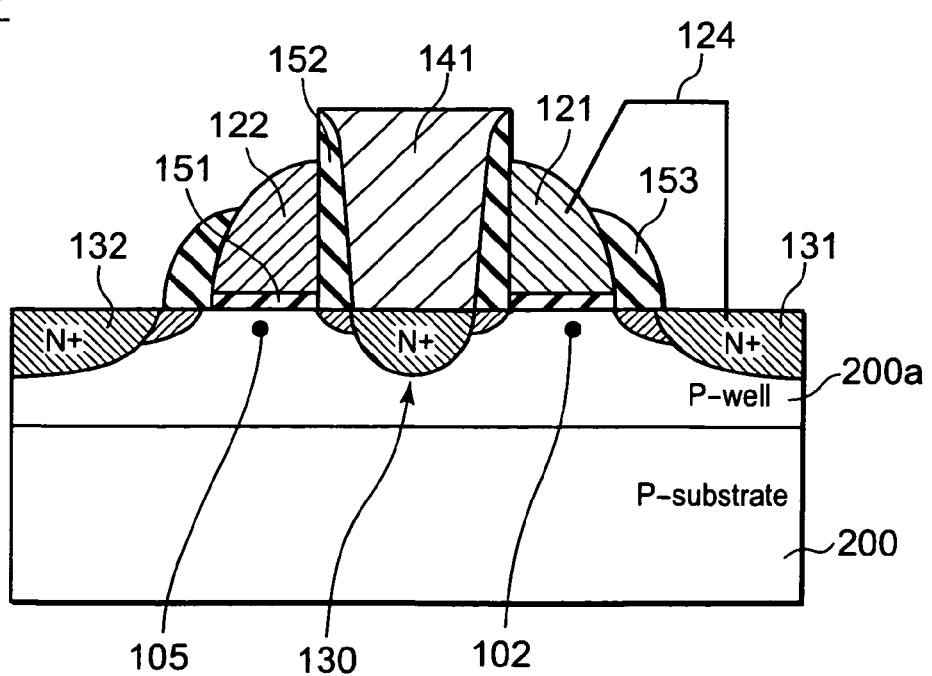
FIG. 39 is a cross sectional view showing a structure along lines A-A' of FIG. 38.

FIG. 39 is a cross sectional view taken on line A-A' of FIG. 38.

The common source electrode 141 is provided directly on the N-type diffusion layer region 130 provided in the surface region of a well 200a provided on the semiconductor substrate 200. The transistors 102 and 105 are united into one and disposed separately at both sides of the common source electrode 141 with a side wall insulation film 152 therebetween respectively. The gate electrodes 121 and 122 are provided on the well 200a of the semiconductor device 200 through a gate insulation film 151 having a predetermined thickness. Outside the gate electrodes 121 and 122 is provided a spacer insulation film 153 that insulates the gate electrodes 121 and 122 electrically from the N-type diffusion layer regions 131 and 132, which are source-drain regions. The gate lengths of the transistors 102 and 105 formed separately at both side faces of the common source electrode 141 are determined by the widths of the gate electrodes 121 and 122 on the crossing face respectively. The transistors 102 and 105 formed at both side faces of the common source electrode 141 in such a way share one side of each of their source-drain regions in the N-type diffusion layer region 130 formed just under the common source electrode 141 and are connected to the common source electrode 141 respectively. The gate electrode 121 is connected to the N-type diffusion layer region 131 through the wiring 124.

In FIG. 37, the nodes 121a, 131a, 132a, and 141a are shown in the gate electrode 121 (122), the N-type diffusion layer region 131, the N-type diffusion layer region 132, and the common electrode 141 themselves, or in the wiring layer connected to that.

Next, there will be described the operation of this current mirror circuit. When an input current I1 flows in the route consisting of the node 131a, the transistor 102, and the node 141a, almost the output current I2 that almost the same as the input current I1 comes to flow in the route consisting of the node 132a, the transistor 105, and the node 141a. At this time, if the transistors 102 and 105 are the same in shape and characteristic, the output current I2 comes to be the same as the input current I1.

Next, there will be described how to manufacture the semiconductor device in the fourth exemplary embodiment of the present invention. Except for an added step of forming the wiring 124 for connecting the gate electrode 121 to the N-type diffusion layer region 131 (e.g., at first, an inter-layer insulation film is formed to cover the whole region, then a contact to be connected to the gate electrode 121 and a contact to be connected to the N-type diffusion layer region 131 are formed in the inter-layer insulation film respectively and those contacts are connected to each other through a wiring layer), this manufacturing method is the same as that in the first exemplary embodiment. Thus the other descriptions will be omitted here.

Even in the fourth exemplary embodiment, except for the effect that normal reading from the SRAM unit cells is assured, it is possible to obtain the same effects as that in the first exemplary embodiment.

Furthermore, in the fourth exemplary embodiment, the transistors 102 and 105 are united into one in the current mirror circuit to enable the tendency of gate length variation to be matched between those transistors 102 and 105. Consequently, the transistors 102 and 105 can also be matched very accurately in shape and characteristic. As a result, the output current I2, which is equivalent to the input current I1, can be obtained very accurately.

Fifth Exemplary Embodiment

Figure 40:
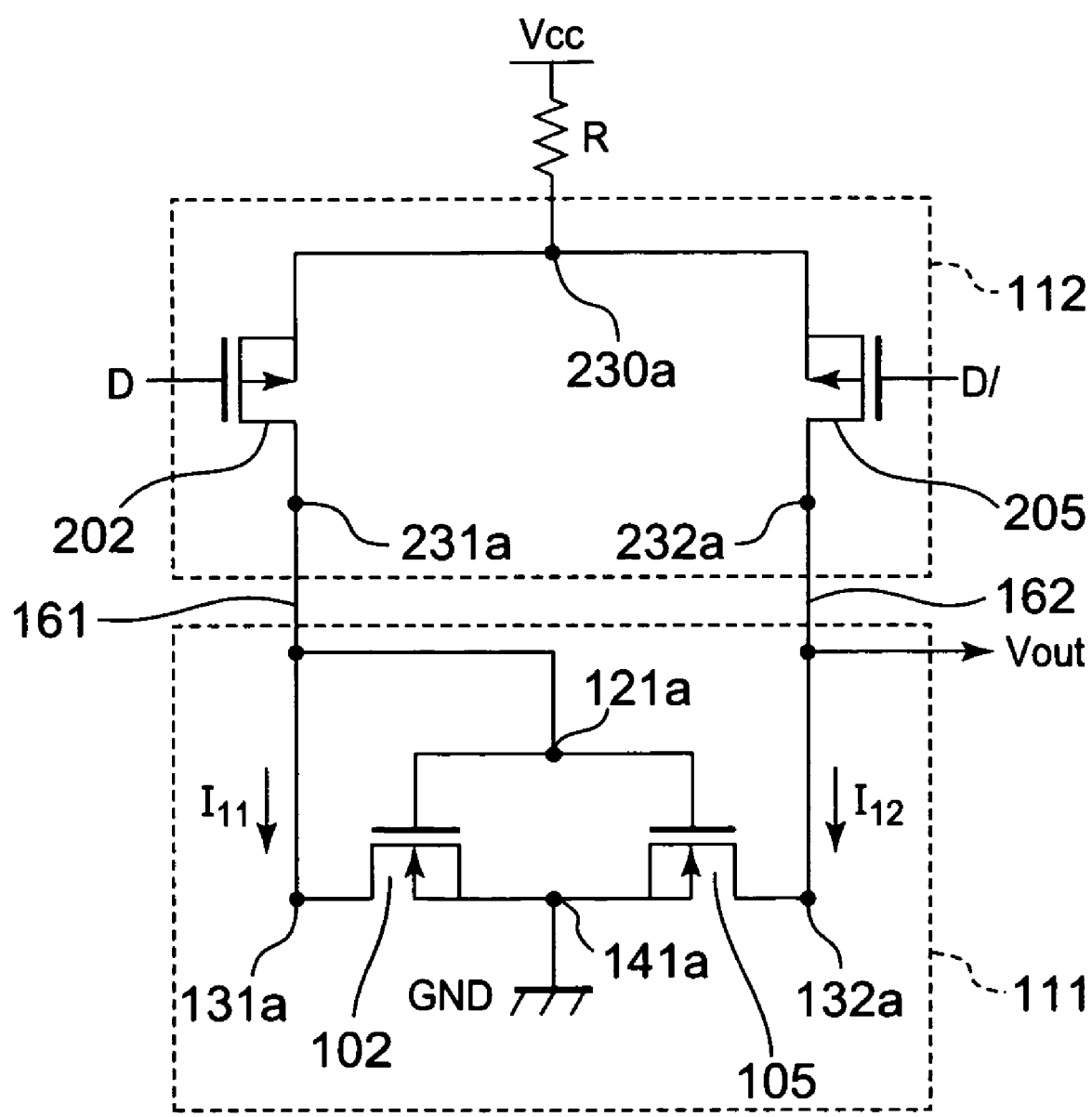
FIG. 40 is a circuit diagram showing a configuration of a semiconductor device according to a fifth embodiment of the present invention.

At first, there will be described a configuration of a semiconductor device in the fifth exemplary embodiment of the present invention. In the fifth exemplary embodiment, a current mirror type sense amplifier will be picked up as an example for describing the semiconductor device of the present invention. FIG. 40 is a circuit diagram of the semiconductor device in a configuration employed in the fifth exemplary embodiment of the present invention. The current mirror type sense amplifier includes sub-unit blocks 111 and 112.

The sub-unit block 111 is a current mirror circuit that includes two NMOS transistors (transistors 102 and 105). The transistor 102 connects one side (source side) of its source-drain electrode to a node 141a, the other side (drain side) thereof to a node 131a, and its gate electrode to a node 121a respectively. The node 121a is connected to the node 131a. On the other hand, the transistor 105 connects one side (source side) of its source-drain electrode to a node 141a, the other (drain) side thereof to a node 132a, and its gate electrode to a node 121a respectively.

The sub-unit block 112 is a differential input block that includes two PMOS transistors (transistors 202 and 205). The transistor 202 connects one (source) side of its source-drain electrode to a node 230a, the other (drain) side thereof to a node 231a, and its gate electrode to a data line D to be sensed respectively. The node 231a is connected to the node 231a. On the other hand, the transistor 205 connects one (source) side of its source-drain electrode to a node 230a, the other (drain) side thereof to a node 232a, and its gate electrode to a data line D/ to be sensed respectively. The node 232a is connected to the node 132a.

Figure 41:
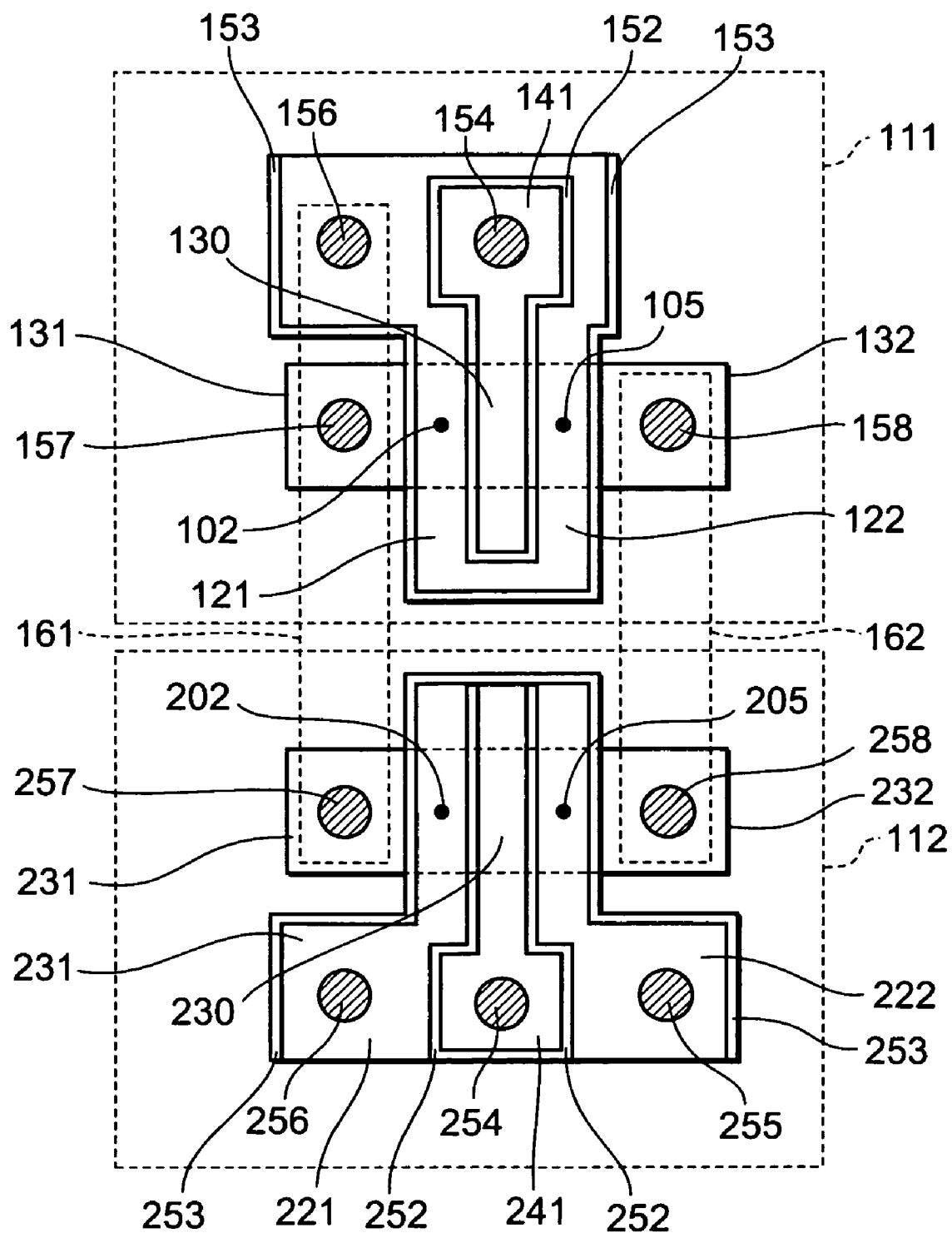
FIG. 41 is a partial top view showing a configuration of a semiconductor device according the fifth embodiment of the present invention.

FIG. 41 is a partial top view of the configuration of the semiconductor device in the fifth exemplary embodiment of the present invention. In the sub-unit block 111, the transistor 102 includes a gate electrode 121, an N-type diffusion layer region 131 corresponding to one side of its source-drain electrode, and an N-type diffusion layer region 130 corresponding to the other side of the source-drain electrode. The N-type diffusion layer region 130 is provided under the common source electrode 141 that functions as a wiring layer. The gate electrode 121 includes a side wall insulation film 152 on one side wall and a spacer insulation film 153 on the other side wall thereof. On the other hand, the transistor 105 includes a gate electrode 122, an N-type diffusion layer region 132 corresponding to one side of its source-drain electrode, and an N-type diffusion layer region 130 corresponding to the other side of the source-drain electrode. The gate electrode 122 is connected to the gate electrode 121 electrically. This means that the gate electrodes 122 and 121 are provided so as to surround the common source electrode 141. The N-type diffusion layer region 130 is the same as that of the transistor 102 (in configuration). The gate electrode 122 includes a side wall insulation film 152 on one side wall and a spacer insulation film 153 on the other side wall thereof.

In the sub-unit block 112, the transistor 202 includes a gate electrode 221, an P-type diffusion layer region 231 corresponding to one side of its source-drain electrode, and an P-type diffusion layer region 230 corresponding to the other side of the source-drain electrode. The P-type diffusion layer region 230 is provided under the source electrode 241 that functions as a wiring layer. The gate electrode 221 includes a side wall insulation film 252 on one side wall and a spacer insulation film 253 on the other side wall thereof. On the other hand, the transistor 205 includes a gate electrode 222, a P-type diffusion layer region 232 corresponding to one side of its source-drain electrode, and a P-type diffusion layer region 230 corresponding to the other side of the source-drain electrode. The gate electrode 222 is separated from the gate electrode 221. The P-type diffusion layer region 230 is the same as that of the transistor 202 (in configuration). The gate electrode 222 includes a side wall insulation film 252 on one side wall and a spacer insulation film 253 on the other side wall thereof.

At an end portion of the gate electrode 121 is provided a node joint having a contact 156. The contact 156, the contact 157 of the N-type diffusion layer region 131, and the contact 257 of the P-type diffusion layer region 231 are connected to each another through a wiring layer 161. The contact 158 of the N-type diffusion layer region 132 and the contact 258 of the P-type diffusion layer region 232 are connected to each other through a wiring layer 162.

In FIG. 40, the nodes 121a, 131a, 132a, 141a, 230a, 231a, and 232a are shown in the gate electrode 121 (122), the N-type diffusion layer region 131, the N-type diffusion layer region 132, the node electrode 141, the P-type diffusion layer region 230, the P-type diffusion layer region 231, and the P-type diffusion layer region 232 themselves, and in the wiring layer connected to them.

Next, there will be described the operation of this current mirror type sense amplifier. When the data line D denotes the "L" level and the data line D/ denotes the "H" level, the transistor 202 is turned on and the transistor 205 is turned off. Consequently, a current I11 flows in the route consisting of the resistor R, the node 230a, the transistor 202, the node 231a, the node 131a, and the transistor 102. As a result, a current I12 that is almost the same as the current I11 comes to flow from the Vout to the node 132a and to the transistor 105. On the other hand, when the data line D denotes the "H" level and the data line D/ denotes the "L" level, the transistor 202 is turned off and the transistor 205 is turned on. Consequently, the flow of the current I11 stops. As a result, the flow of the current I12 also stops. Thus the VCC voltage is output to the Vout. Each of the transistors disposed in this current mirror type sense amplifier may be reversed in conductivity. In this case, it will be apparent to those skilled in the art that the positions of the power supplies (VCC and GND) are exchanged respectively and how the operations will become.

Here, the description for how to manufacture the semiconductor device in the fifth exemplary embodiment of the present invention will be omitted, since it is the same as that in the third exemplary embodiment.

Even in the fifth exemplary embodiment, it is possible to obtain the same effects of the first exemplary embodiment except for the effect of assuring the normal reading from the SRAM unit cells, as well as the same effects as those in the fourth exemplary embodiment.

Furthermore, in the fifth exemplary embodiment, the transistors 102 and 105 put together to constitute the differential input block of the current mirror type sense amplifier are formed unitarily, thereby those transistors 102 and 105 can have the same tendency about the gate length variation. Consequently, the transistors 102 and 105 can also be matched very accurately in shape and characteristic (especially, severe threshold values), thereby the output voltage (Vout) variation can be suppressed low.

If a pair of bipolar transistors is used for the differential input block, the output voltage (Vout) variation is lowered more than in the case in which MOS transistors are used. This is because the base-emitter voltage (VBE) of the bipolar transistor is very low in variation. However, if bipolar transistors are used in such a way for the differential input block, the increase of the circuit area is unavoidable. And employment of the fifth exemplary embodiment can avoid such problems, thereby realizing both low variation of the output voltage (Vout) and reduction of the circuit area.

Although the invention has been described above in connection with several exemplary embodiments thereof, it will be appreciated by those skilled in the art that those embodiments are provided solely for illustrating the invention, and should not be relied upon to construe the appended claims in a limiting sense.

Further, it is noted that, notwithstanding any claim amendments made hereafter, applicant's intent is to encompass equivalents all claim elements, even if amended later during prosecution.

What is claimed is:

1. A semiconductor device, comprising:
   a semiconductor substrate;
   a first transistor including first gate electrode a first diffusion region, and a second diffusion region respectively formed in the semiconductor substrate;
   a second transistor including a second gate electrode, the first diffusion region, and a third diffusion region respectively formed in the semiconductor substrate;
   a third transistor including the first gate electrode, a fourth diffusion region, and a fifth diffusion region respectively formed in the semiconductor substrate; and
   a node electrode formed above the first diffusion layer and coupled thereto,
   wherein the first gate electrode and the second gate electrode are formed separately at respective side walls of the node electrode,
   wherein the node electrode is coupled to the fourth diffusion region,
   wherein a third gate electrode is formed at a side wall of the node electrode,
   wherein a gate width of the first transistor is wider than that of the second transistor.

2. The semiconductor device according to claim 1, wherein the first transistor and the second transistor comprise first conductivity type transistors, and
   wherein the third transistor comprises a second conductivity type transistor.

3. The semiconductor device according to claim 1, wherein the node electrode comprises a first node electrode, the semiconductor device further comprising:
   a fourth transistor including a fourth gate electrode, a sixth diffusion region, and a seventh diffusion region formed in the semiconductor substrate respectively;
   a fifth transistor including a fifth gate electrode, the sixth diffusion region, and an eighth diffusion region respectively formed in the semiconductor substrate;
   a sixth transistor including the fourth gate electrode, a ninth diffusion region, and a tenth diffusion region respectively formed in the semiconductor substrate; and
   a second node electrode formed above the sixth diffusion layer, and coupled thereto,
   wherein the fourth gate electrode and the fifth gate electrode are formed separately at side walls of the second node electrode,
   wherein the second node electrode is coupled to the ninth, diffusion region,
   wherein a sixth gate electrode is formed at the side wall of the second node electrode,
   wherein the first gate electrode and third gate electrode are coupled to the second node electrode respectively,
   wherein the fourth gate electrode and the sixth gate electrode are coupled to the first node electrode, and
   wherein a gate width of the fourth transistor is wider than that of the fifth transistor.

4. The semiconductor device according to claim 1, wherein the node electrode comprises a first node electrode, the semiconductor device further comprising:
   a fourth transistor including a fourth gate electrode, a sixth diffusion region, and a seventh diffusion region formed in the semiconductor substrate respectively:
   a fifth transistor including a fifth gate electrode, the sixth diffusion region, and an eighth diffusion region respectively formed in the semiconductor substrate;
   a sixth transistor including the fourth gate electrode, a ninth diffusion region, and a tenth diffusion region respectively formed in the semiconductor substrate; and
   a second node electrode formed above the sixth diffusion layer, and coupled thereto,
   wherein the fourth gate electrode and the fifth gate electrode are formed separately at side walls of the second node electrode,
   wherein the second node electrode is coupled to the ninth diffusion region,
   wherein a sixth gate electrode is formed at the side wall of the second node electrode,
   wherein the first gate electrode and third gate electrode are coupled to the second node electrode respectively,
   wherein the fourth gate electrode and the sixth gate electrode are coupled to the first node electrode, and
   wherein the first transistors, the second transistors, the fourth transistor, and the fifth transistors comprise first conductivity type transistors, and wherein the third transistor and the sixth transistor comprise second conductivity type transistors.

5. The semiconductor device according to claim 1, wherein the node electrode comprises a first node electrode, the semiconductor device further comprising:
a fourth transistor including a fourth gate electrode, a sixth diffusion region, and a seventh diffusion region formed in the semiconductor substrate respectively;
a fifth transistor including a fifth gate electrode, the sixth diffusion region, and an eighth diffusion region respectively formed in the semiconductor substrate;
a sixth transistor including the fourth gate electrode, a ninth diffusion region, and a tenth diffusion region respectively formed in the semiconductor substrate; and
a second node electrode formed above the sixth diffusion layer, and coupled thereto,
wherein the fourth gate electrode and the fifth gate electrode are formed separately at side walls of the second node electrode,
wherein the second node electrode is coupled to the ninth diffusion region,
wherein a sixth gate electrode is formed at the side wall of the second node electrode,
wherein the first gate electrode and third gate electrode are coupled to the second node electrode respectively,
wherein the fourth gate electrode and the sixth gate electrode are coupled to the first node electrode, and
wherein the first gate electrode comprises a first end portion formed at a side corresponding to the second node electrode,
wherein the fourth gate electrode comprises a second end portion formed at a side corresponding to the first node electrode,
wherein the first node electrode, the second node electrode, the first gate electrode, and the fourth gate electrode are extended in a first direction respectively,
wherein the first end portion is extended in a second direction being different from the first direction,
wherein the second end portion is extended an opposite direction of the second direction,
wherein, in the first direction, the second node electrode is disposed so as to correspond to the first end portion, and
wherein, in the first direction, the first node electrode is disposed so as to correspond to the second end portion.

6. The semiconductor device according to claim 1, wherein the node electrode comprises a first node electrode, the semiconductor device further comprising:
a fourth transistor including a fourth gate electrode, a sixth diffusion region, and a seventh diffusion region formed in the semiconductor substrate respectively;
a fifth transistor including a fifth gate electrode, the sixth diffusion region, and an eighth diffusion region respectively formed in the semiconductor substrate;
a sixth transistor including the fourth gate electrode, a ninth diffusion region, and a tenth diffusion region respectively formed in the semiconductor substrate; and
a second node electrode formed above the sixth diffusion layer, and coupled thereto,
wherein the fourth gate electrode and the fifth gate electrode are formed separately at side walls of the second node electrode,
wherein the second node electrode is coupled to the ninth diffusion region,
wherein a sixth gate electrode is formed at the side wall of the second node electrode,
wherein the first gate electrode and third gate electrode are coupled to the second node electrode respectively,
wherein the fourth gate electrode and the sixth gate electrode are coupled to the first node electrode, and
wherein the first gate electrode comprises a first end portion formed at a side corresponding to the second node electrode,
wherein the first node electrode comprises a second end portion formed at a side corresponding to the fourth gate electrode,
wherein the second node electrode comprises a third end portion formed at a side corresponding to the first gate electrode,
wherein the fourth gate electrode comprises a fourth end portion formed at a side corresponding to the first node electrode,
wherein the first node electrode, the second node electrode, the first gate electrode, and the fourth gate electrode are extended in a first direction respectively,
wherein the first end portion and the third end portion, are extended in a second direction being different from the first direction respectively, and
wherein the second end portion and the fourth end portion are extended in an opposite direction of the second direction respectively.

7. The semiconductor device according to claim 6, wherein, in the first direction, the first end portion is disposed so as to correspond to the third end portion, and
wherein, in the first direction, the second end portion is disposed so as to correspond to the fourth end portion.

8. A semiconductor device, comprising:
a semiconductor substrate;
a first transistor including a first gate electrode, a first diffusion region, and a second diffusion region respectively formed in the semiconductor substrate;
a second transistor including a second gate electrode, the first diffusion region, and a third diffusion region respectively formed in the semiconductor substrate;
a third transistor including the first gate electrode, a fourth diffusion region, and a fifth diffusion region respectively formed in the semiconductor substrate;
a node electrode formed above the first diffusion layer and coupled thereto,
wherein the first gate electrode and the second gate electrode are formed separately at respective side walls of the node electrode,
wherein the node electrode is coupled to the fourth diffusion region, and
wherein a third gate electrode is formed at a side wall of the node electrode; and
a fourth transistor including a fourth gate electrode, a sixth diffusion region, and a seventh diffusion region formed in the semiconductor substrate respectively,
wherein the node electrode is coupled to the sixth diffusion region, and
wherein the fourth gate electrode is formed at the side wall of a second node electrode.

9. A semiconductor device, comprising:
a semiconductor substrate;
a first diffusion region in the semiconductor substrate;
a second diffusion region in the semiconductor substrate;
a third diffusion region in the semiconductor substrate;
a node electrode coupled to the first diffusion region;
an insulating layer formed on a side of the node electrode;
a first gate electrode formed as a side wall of the node electrode and the insulating layer, and disposed between the first diffusion region and the second diffusion region;

a second gate electrode formed as the side wall of the node electrode and the insulating layer, and disposed between the first diffusion region and the third diffusion region, wherein the node electrode and the insulating layer is disposed between the first gate electrode and the second gate electrode;

a fourth diffusion region formed in the semiconductor substrate; and a third gate electrode formed as the side wall of the node electrode and the insulating layer, the fourth diffusion region being formed at a side of the third gate electrode and the first diffusion region being formed at a side of the first and second gate electrodes, wherein the node electrode is extended in a predetermined direction, and wherein, in the predetermined direction, the first gate electrode and the third gate electrode are disposed in parallel.

10. A semiconductor device, comprising:
a semiconductor substrate;
a first diffusion region in the semiconductor substrate;
a second diffusion region in the semiconductor substrate;
a third diffusion region in the semiconductor substrate;
a node electrode coupled to the first diffusion region;
an insulating layer formed on a side of the node electrode;
a first gate electrode formed as a side wall of the node electrode and the insulating layer, and disposed between the first diffusion region and the second diffusion region;
a second gate electrode formed as the side wall of the node electrode and the insulating layer, and disposed between the first diffusion region and the third diffusion region,
wherein the node electrode comprises a first node electrode,
wherein the insulating layer comprises a first insulating layer;
a fourth diffusion region in the semiconductor substrate;
a fifth diffusion region on the semiconductor substrate;
a sixth diffusion region on the semiconductor substrate;
a second node electrode coupled to the fourth diffusion region;
a second insulating layer formed on a side of the second node electrode;
a third gate electrode formed as a side wall of the second node electrode and the second insulating layer, and disposed between the fourth diffusion region and the fifth diffusion region;
a fourth gate electrode formed as the side wall of the second node electrode and the second insulating layer, and disposed between the fourth diffusion region and the sixth diffusion region;
a first data line coupled to the third gate electrode;
a second data line coupled to the fourth gate electrode; and
a terminal coupled to the third diffusion region and the sixth diffusion region respectively,
wherein the first gate electrode, the second gate electrode, the second diffusion region, and the fifth diffusion region are coupled to each other, and
wherein the terminal is output a voltage based on a voltage of the first data line, and on a voltage of the second data line.

11. The semiconductor device according to claim 1, further comprising:
a fourth transistor including a fourth gate electrode, the fourth diffusion region, and a sixth diffusion region respectively formed in the semiconductor substrate; and
a second node electrode formed above the fourth diffusion layer, and coupled thereto,
wherein the fifth diffusion region is coupled to the second diffusion region, and
wherein the sixth diffusion region is coupled to the third diffusion region.

12. A semiconductor device, comprising:
a semiconductor substrate;
a first diffusion region in the semiconductor substrate;
a second diffusion region in the semiconductor substrate;
a third diffusion region in the semiconductor substrate;
a node electrode coupled to the first diffusion region;
an insulating layer formed on a side of the node electrode;
a first gate electrode formed as a side wall of the node electrode and the insulating layer, and disposed between the first diffusion region and the second diffusion region;
a second gate electrode formed as the side wall of the node electrode and the insulating layer, and disposed between the first diffusion region and the third diffusion region;
a fourth diffusion region formed in the semiconductor substrate; and
a third gate electrode formed as the side wall of the node electrode and the insulating layer, and disposed between the first diffusion region and the fourth diffusion region.

* * * * *